(12) United States Patent
Yokoyama et al.

(10) Patent No.: US 6,816,095 B1
(45) Date of Patent: Nov. 9, 2004

(54) PARALLEL/SERIAL CONVERSION CIRCUIT, LIGHT OUTPUT CONTROL CIRCUIT, AND OPTICAL RECORDING APPARATUS

(75) Inventors: Koichi Yokoyama, Kanagawa (JP); Katsunori Sato, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/432,157

(22) PCT Filed: Sep. 25, 2002

(86) PCT No.: PCT/JP02/09856
§ 371 (c)(1),
(2), (4) Date: May 20, 2003

(87) PCT Pub. No.: WO03/028221
PCT Pub. Date: Apr. 3, 2003

(30) Foreign Application Priority Data

Sep. 26, 2001 (JP) ........................ 2001-293109

(51) Int. Cl.$^7$ .............................................. H03M 9/00
(52) U.S. Cl. ...................... 341/101; 341/100; 369/59.2; 369/59.11; 369/59.12; 369/59.24
(58) Field of Search ............................ 369/59.1–59.27, 369/116; 341/100, 101

(56) References Cited

U.S. PATENT DOCUMENTS 5,150,351 A * 9/1992 Ohno et al. ................. 369/116
5,327,411 A * 7/1994 Iwasa et al. ............... 369/59.12
5,587,980 A * 12/1996 Kablau et al. ............. 369/53.31
5,642,343 A * 6/1997 Toda et al. ................ 369/47.53
6,529,466 B2 * 3/2003 Saga et al. .................. 369/116
6,631,110 B1 * 10/2003 Seo et al. ................. 369/59.12

FOREIGN PATENT DOCUMENTS

| EP | 0 977 184 A2 | 2/2000 |
| JP | 08-287465 A1 | 11/1996 |
| JP | 2000-18362 A1 | 2/2000 |
| JP | 2000-222731 A1 | 8/2000 |

OTHER PUBLICATIONS

International Search Report Jan. 14, 2003.

* cited by examiner

*Primary Examiner*—Michael Tokar
*Assistant Examiner*—Khai Nguyen
(74) *Attorney, Agent, or Firm*—Rader, Fishman & Grauer PLLC; Ronald P. Kananen

(57) ABSTRACT

A high speed, high accuracy parallel/serial conversion circuit, wherein a PLL circuit 50 receives as input and locks a clock CLK, and supplies the same to different parts of an apparatus; the PLL circuit 50 controls a 16-tap ring oscillator 60 to shift the phase of a clock frequency-locked to a reference clock so as to generate 32 types of phase shift pulses CK0 to CK31 shifted in phase by increments of $\frac{1}{32}$ of the clock width from the reference clock by the differential outputs of the 16 taps and supplies the same to a P/S conversion circuit 70; and the P/S conversion circuit 70 generates fine width pulses with $\frac{1}{32}$ pulse widths based on the 32 types of phase shift pulses shifted in phase by increments of $\frac{1}{32}$. Further, the fine width pulses are used to convert parallel signals output from a RAM 30 and a decoder 40 to a serial signal.

15 Claims, 19 Drawing Sheets

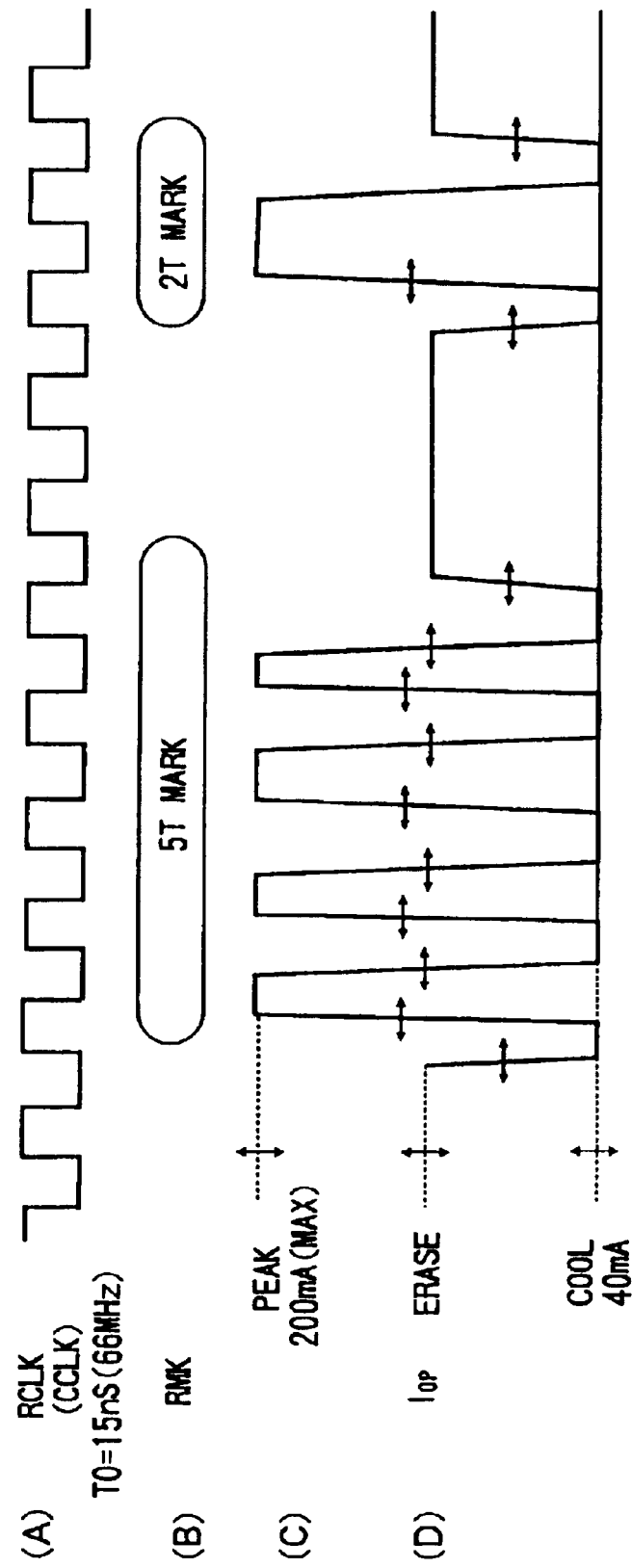

FIG.3

| REGISTER ADDRESS | REGISTER NO. | FUNCTION |
|---|---|---|
| 00h | MREG 0 | REGISTER FOR SETTING PAGE ADDRESS DATA SHOWING SUB ADDRESS OF RAM |
| 01h | MREG 1 | CONTROL POWER-SAVE OF CHANNELS OF OUTPUTS TP1 TO TP4, GP1 TO GP4 |
| 02h | MREG 2 | SAVE POWER OF CHIP |
| 03h | MREG 3 | SET LOCK RANGE OF PLL AND SELECT OPERATION MODE AND NUMBER OF INPUT CHANNELS |
| 04h | MREG 4 | SELECT TEST MODE, SELECT STRAGEGY MODE, AND SELECT OUTPUT POWER MODE |
| 05h | MREG 5 | TURNS ON/OFF MONITOR OUTPUT |
| 06h | MREG 6 | CONTROL WRITE GATE AND SET WG TIMER |
| 07h | MREG 7 | SET MODE TO LOWER OPERATION FREQUENCY OF PLL AND OPERATE IT AT LOW FREQUENCY |

PARALLEL/SERIAL CONVERSION CIRCUIT, LIGHT OUTPUT CONTROL CIRCUIT, AND OPTICAL RECORDING APPARATUS

TECHNICAL FIELD

The present invention relates to a parallel/serial conversion circuit for converting parallel signal input to a serial pulse signal and outputting the same, a light output control circuit for controlling a light output from a light source for emitting various types of information to a rewritable optical recording medium, etc., such as a phase change type optical disk, and an optical recording apparatus.

BACKGROUND ART

In recent years, advances have been made in increasing the speeds of a variety of electronic apparatuses. For example, in an optical recording apparatus for writing information on an optical disk, an increase in the speed of the conversion operation is being sought for the parallel/serial conversion circuit (hereinafter called the "P/S circuit") that converts the recording data from parallel signals to a serial signal and outputs the results to a laser driver.

However, when trying to increase the speed of the conversion operation in a P/S circuit, since the serial signal after parallel/signal conversion becomes a super high speed, a super high speed clock is required for outputting the serial signal. Increasing the speed of the clock ends up creating obstacles in technology and cost.

DISCLOSURE OF THE INVENTION

A first object of the present invention is to provide a parallel/serial conversion circuit able to realize higher speed and higher accuracy at a low cost without using a super high speed clock.

A second object of the present invention is to provide a light output control circuit and an optical recording apparatus using this parallel/serial conversion circuit to optimize waveform control of a serial output pulse signal with a high speed and a high accuracy.

To achieve the objects, a first aspect of the present invention is a parallel/serial conversion circuit for converting parallel signals input to a serial pulse signal and outputting the same, having a phase shifting means for shifting a phase of a reference clock pulse by increments of 1/n width of a pulse width, a fine width pulse generating means for receiving as input two phase shift pulses among the phase shift pulses shifted by the phase shifting means and generating a fine width pulse from a phase difference between the two, and a serial signal generating means for serially adding the fine width pulses generated by the fine width pulse generating means corresponding to the parallel signal input and outputting a serial pulse signal.

A second aspect of the present invention is a light output control circuit which controls a light output of a light source for emitting predetermined data light to an optical medium, having a light source driver that drives the light source in response to the serial pulse signal and a parallel/serial conversion circuit which receives as input parallel signals based on waveform data corresponding to light data to be emitted by the light source, converts the parallel signals to a serial pulse signal, and outputs the same to the light source driver, the parallel/serial conversion circuit having a phase shifting means for shifting a phase of a reference clock pulse by increments of 1/n width of a pulse width, a fine width pulse generating means for receiving as input two phase shift pulses among the phase shift pulses shifted by the phase shifting means and generating a fine width pulse from a phase difference between the two, and a serial signal generating means for serially adding the fine width pulses generated by the fine width pulse generating means corresponding to the parallel signal input and outputting a serial pulse signal.

Preferably, it further has a waveform data memory for storing waveform data corresponding to data to be emitted by the light source, an accessing means for receiving as input the data to be emitted by the light source, judging the address of the waveform data memory corresponding to the input data, and accessing the waveform data memory, and a decoding means for decoding the waveform data read from the waveform data memory by the accessing means and outputting parallel signals which indicate the pulse waveform data to a parallel/serial conversion circuit.

Further, preferably, the fine width pulse generating means generates the fine width pulse from two adjacent phase shift pulses among the phase shifted pulses shifted by the phase shifting means.

Further, it has a changing means for receiving as input two adjacent phase shift pulses among the phase shift pulses shifted by the phase shifting means and changing their levels to different levels; and the fine width pulse generating means generates the fine width pulse from the two phase shift pulses changed in level by the level changing means.

Further, in the present invention, the phase shifting means includes a ring oscillator connecting a plurality of cells in a ring.

Preferably, the phase shifting means includes a ring oscillator connecting a plurality of delay cells in a ring, and the plurality of delay cells are laid out so as to make delays cells which become odd-numbered stages and even-numbered stages when connected in a ring face each other and so that interconnects which connect them become approximately equal.

A third aspect of the present invention is an optical recording apparatus for outputting a light source drive signal to a light source driver which writes data to an optical recording medium based on recording data indicating a length of a mark to be recorded on the optical recording medium, having a parallel/serial conversion circuit for receiving as input parallel signals based on waveform data read from a waveform data memory corresponding to a length of a mark recorded on the optical recording medium, converting the parallel signals to a serial pulse signal, and outputting the same to the light source driver, the parallel/serial conversion circuit having a phase shifting means for shifting a phase of a reference clock pulse by increments of 1/n width of the pulse width, a fine width pulse generating means for receiving as input two phase shift pulses among the phase shift pulses shifted by the phase shifting means and generating a fine width pulse based on a phase difference between the two, and a serial signal generating means for serially adding the fine width pulses generated by the fine width pulse generating means corresponding to the parallel signal input and outputting a serial pulse signal.

According to the parallel/serial conversion circuit of the present invention, since it shifts a phase of a reference clock pulse by increments of 1/n width of the pulse width, generates a fine width pulse from the phase difference between two phase shift pulses among the phase shift pulses, serially adds the fine width pulses corresponding to the parallel signal input, and outputs a serial pulse signal, it is possible to realize a higher speed and a higher accuracy of the P/S conversion at a low cost without using a super high speed clock.

Further, according to the present invention, when receiving as input parallel signals based on waveform data read from a waveform data memory corresponding to a length of a mark to be recorded on an optical recording media and converting these parallel signals to a serial signal by a parallel/serial conversion circuit and outputting the same to a light driver, since it shifts the phase of a reference clock pulse by increments of 1/n width of the pulse width, generates a fine width pulse from the phase difference between two phase shift pulses among the phase shift pulses, serially adds the fine width pulses corresponding to the parallel signal input, and outputs a serial pulse signal, it is possible to realize a higher speed and a higher accuracy of P/S conversion at a low cost without using a super high speed clock and optimize waveform control of a pulse signal output to a light source driver for high speed and high accuracy.

BRIEF DESCRIPTION OF THE DRAWINGS

FIGS. 2(A) to (D) are views for explaining a reference clock and a light drive pulse signal used in a light driver shown in FIG. 1.

FIG. 3 is a view for explaining the functions of mode registers.

BEST MODE FOR CARRYING OUT THE INVENTION

Below, an embodiment of the present invention will be explained in detail with reference to the drawings.

Figure 1:
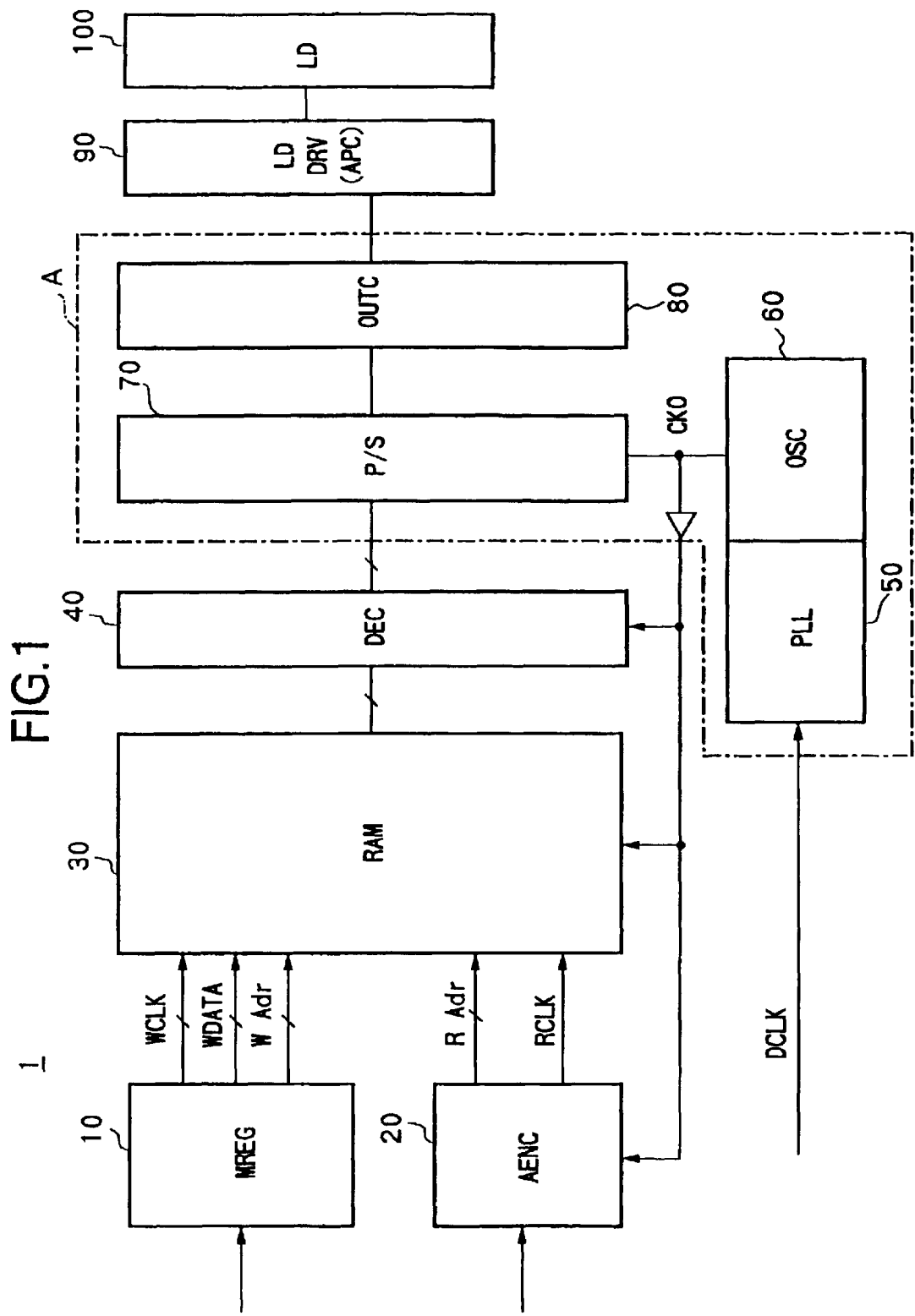
FIG. 1 is a block diagram of an embodiment of a light output control circuit according to the present invention.

FIG. 1 is a block diagram of an embodiment of a light output control circuit according to the present invention.

The present light output control circuit 1 has, as shown in FIG. 1, a mode register (MREG) unit 10, an address encoder (AENC) 20, a RAM (waveform data memory) 30, a decoder (DEC) 40, a PLL (Phase Locked Loop) circuit 50, a 16-tap ring oscillator (OSC) 60 as a phase shifting means, a parallel/serial (P/S) conversion circuit 70, an output circuit (OUTC) 80, a light source driver (LDDRV) 90, and a laser light source (LD) 100.

Among these components, the mode register unit 10, the address encoder 20, the RAM 30, the decoder 40, the PLL circuit 50, the 16-tap ring oscillator 60, the P/S conversion circuit 70, and the output circuit 80 constitute a pulse signal generation circuit.

Further, in the circuit shown in FIG. 1, the PLL circuit 50, the 16-tap ring oscillator 60, the P/S conversion circuit 70, and the output circuit 80 constitute a super high-speed bipolar transistor circuit A, which realizes a 5 GHz operation for the above-mentioned high-speed drive, and the other portions constitute a MOS-type circuit by CMOS circuits, etc. Further, the super high-speed bipolar transistor circuit A forms the parallel/serial conversion circuit according to the present invention.

Furthermore, the light output control circuit 1 is, for example, used for a phase change type optical disk apparatus or the like of a rewritable optical disk system, increasing in use in recent years.

This phase change type optical disk requires optimization of the pulse waveform of the write pulse for controlling the laser power. This modified control of a write pulse is called a "write strategy".

Therefore, in the present embodiment, an explanation will be given taking as an example, particularly, a circuit suitable for a write strategy which converts to a light drive signal consisting of a pulse string having fine widths by three levels in response to a record mark length.

First, prior to an explanation of the configurations and functions of the components in the circuit, the light drive signal of the laser light source 100 from the light source driver 90 will be explained.

FIGS. 2(A) to (C) are views for explaining a reference clock used in the light driver 90 and a pulse signal for light drive use. FIG. 2(A) shows a reference clock (channel clock) RCLK (CCLK); FIG. 2(B) shows a record mark RMK; and FIG. 2(C) shows a drive current Iop of the laser light source (LD) 100.

First, in the present example, 1–7 modulation is used as a light modulation scheme, 2T to 8T are used as mark lengths, and 2T to 8T are used as space lengths. Here, T is the period of the channel clock.

Here, assuming the reference clock (channel clock) RCLK (CCLK) shown in FIG. 2(A) is, for example, 66 MHz, 1T becomes 15 nsec.

When recording a mark, write pulses of a number and waveform set for each mark length are output. These write pulses drive the laser light source 100 and control the quantity of heat.

Further, the laser power of the laser light source 100 used in the present example has three values, that is, an erase level (Erase) where the light strikes a space portion of the optical disk medium, a cool level (Cool) where it melts the recording layer to create an amorphous mark, and a peak level (Peak).

The drive current lop is a maximum 200 mA at the peak level (Peak) and about 40 mA at the cool level (Cool), and drives between the cool level (Cool) and the peak level (Peak) by a 1 ns rising edge time/falling edge time.

Further, the light source driver 90 for actual recording by the three-value laser power has an APC (automatic power control) circuit for feedback control.

The drive current lop for driving the laser light source 100, that is, the write pulse, becomes, for example, the waveform shown in FIG. 2(C).

That is, the operation for recording a 5T mark is controlled using the timings of a total of seven pulses comprised of five pulses corresponding to 5T of reference clocks RCLK and one pulse each from before and after them. In the waveform, after an erase level (Erase), four write pulses repeating a cool level (Cool) and a peak level (Peak) are output, and then the cool level (Cool) is returned to the erase level (Erase).

Further, the operation for recording a 2T mark is controlled by the timings of a total of four pulses comprised of two pulses corresponding to 2T of reference clocks RCLK and one pulse each from before and after them. In the waveform, after an erase level (Erase), one write pulse repeating a cool level (Cool) and a peak level (Peak) is output, and then the cool level (Cool) is returned to the erase level (Erase).

The light output control circuit 1 in the present embodiment generates the above-mentioned, light source drive signal in a state optimizing the pulse waveform (write strategy). It sets the waveform data for obtaining the above-mentioned, light source drive signal, generates pulse signals with rising edges and falling edges independently controlled by the waveform data, and supplies the same to a later light-source driver 90.

Note that the targeted accuracy in the circuit of the present example has, for example, made the pulse edge timing about 500 psec to 200 psec.

Therefore, to satisfy this requirement, an integrated circuit (IC) sets a total of eight systems of outputs, including four systems with a ⅟₃₂T accuracy corresponding to a 200 pS resolution and 4 systems with a ¼T accuracy. Further, the IC uses a RAM 30 of a sufficient capacity for storing 50 types of independent parameters for the respective eight systems and uses a bipolar transistor circuit A for high-speed drive in its circuit configuration.

Next, the configurations and the functions of the components in FIG. 1 will be explained in order with reference to the drawings.

The register unit 10 is comprised of a group of registers for registering setting data from the outside to the RAM 30 or the like via a serial interface, and it is used at a different setting mode from the normal operation.

Particularly, in the present example, it is necessary to store the later explained waveform data in the RAM 30. The waveform data are written from the register unit 10 to the RAM 30 by using a write clock WCLK and a write address Wadr.

The register unit 10 has, for example, eight mode registers (MREG0 to MREG7) for setting modes. The mode registers MREG0 to MREG7 have, for example, the functions as shown in FIG. 3.

The mode register MREG0 is a register for setting page address data showing a sub-address of the RAM. The mode register MREG1 is a register for setting data for power saving control for the channel of not shown output ports. The mode register MREG2 is a register for power saving of a chip. The mode register MREG3 is a register for setting a lock range of a PPL circuit 50 and selecting an operation mode and a number of input channels. The mode register MREG4 is a register for setting data to select a test mode, a strategy mode, and an output power mode. The mode register MREG5 is a register for setting data to switch on or off a monitor output. The mode register MREG6 is a register for setting data to control a write gate (WG) and a WG timer. The mode register MREG7 is a register for setting data to set a mode that lowers a PLL operation frequency and operates the PLL at a low frequency.

The addresses of the mode registers MREG0 to MREG7 are, as shown in FIG. 3 allocated as 00h to 07h (h indicates hexadecimal number).

Data to set the mode registers MREG0 to MREG7 are supplied to the mode register unit 10 via a serial interface.

Figure 4:
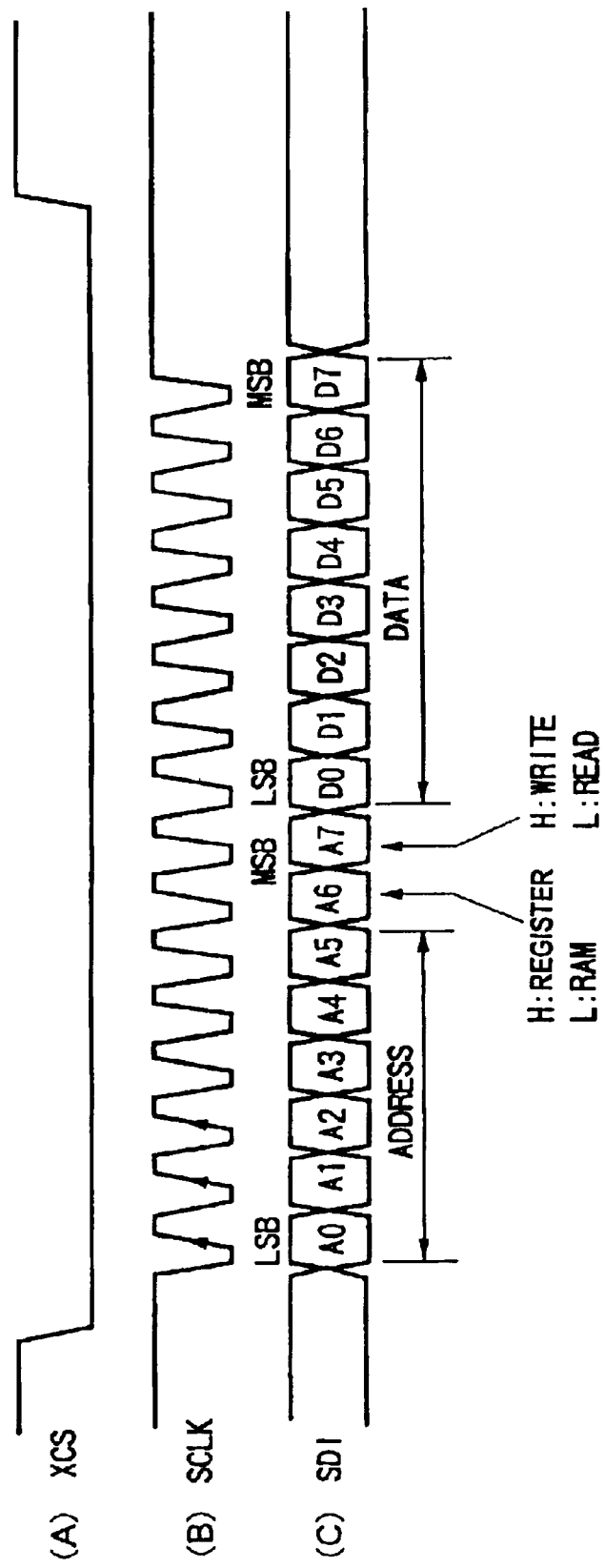
FIGS. 4(A) to (C) are views for explaining data in a serial interface according to the present embodiment.
Figure 5:
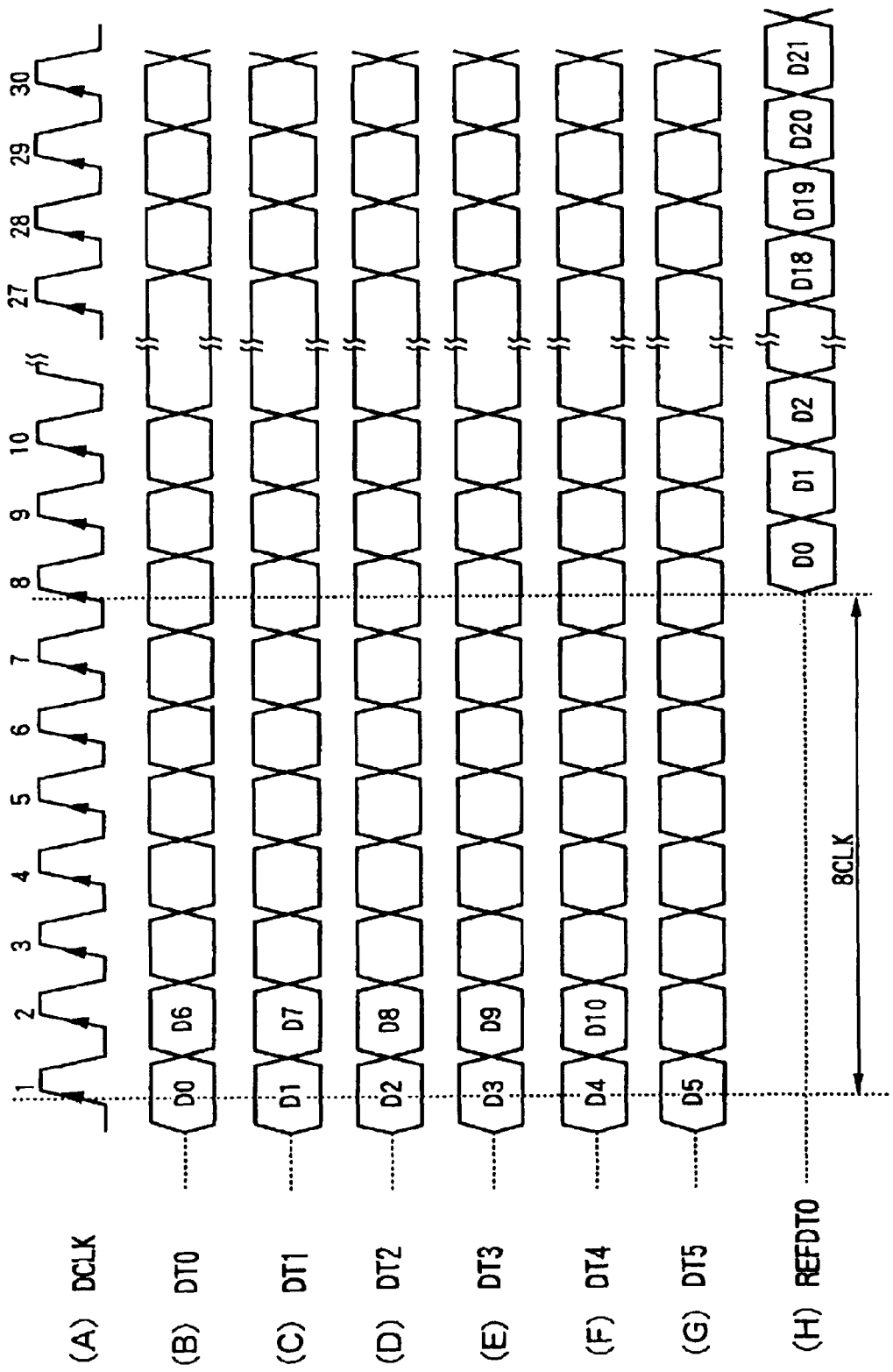
FIGS. 5(A) to (H) are views for explaining recording data, that is, parallel data, in the present embodiment.

The serial interface includes, for example, as shown in FIGS. 4(A) to (C), three signals, that is, a chip select XCS, a serial clock SCLK, and a serial data SDI signal.

The mode register unit 10, as shown in FIGS. 4(A) to C), fetches serial data SDI from the least significant bit (LSB) at the rising edge of the serial clock SCLK and sets the same to a predetermined mode register MREG at the rising edge of the chip select XCS.

Further, as shown in FIG. 4(C), in the serial data SDI, the address bits are A0 to A5, the bit A6 is a register/RAM selection bit, and the bit A7 is a write(WR)/read(RD) selection bit.

For example, by setting the bit A7 to "H" (high level) and setting the bit A6 to "H" to set the bit A5 to "L" (low level) in the register, it is possible to write data in the RAM.

Note that when reading data from the RAM and when writing data in the RAM, it is necessary to write a page address in the mode register MREG0 in advance.

The address encoder 20, at the time of a normal recording operation, receives as input the recording data (NRZI), for example, the parallel data signals DT0 to DT5 shown in FIGS. 5(A) to (H), converts it to serial data at the rising edge timing of the clock signal DCLK, judges the converted recording data (2T~≧8T or 2T~≧4T), generates a read address Radr of the RAM 30 in which is written a pulse pattern corresponding to a mark length and a space length shown by the recording data, outputs the same with a read clock RCLK to the RAM 30, and makes the RAM 30 execute a read operation of the waveform data.

The RAM 30 serving as a waveform data memory stores waveform data comprised by a number of strings of pulse waveform data corresponding to the mark length of the light source drive signal, searches through a memory area based on a read address received from an address encoder 20, and outputs the corresponding waveform data to the decoder 40.

As the method of using the RAM, there are two types of strategy modes, that is, a first strategy mode able to set a pulse pattern of a 2T~≧8T mark length and a second strategy mode able to set a pulse pattern of a 2T~≧4T mark length.

Figure 6:
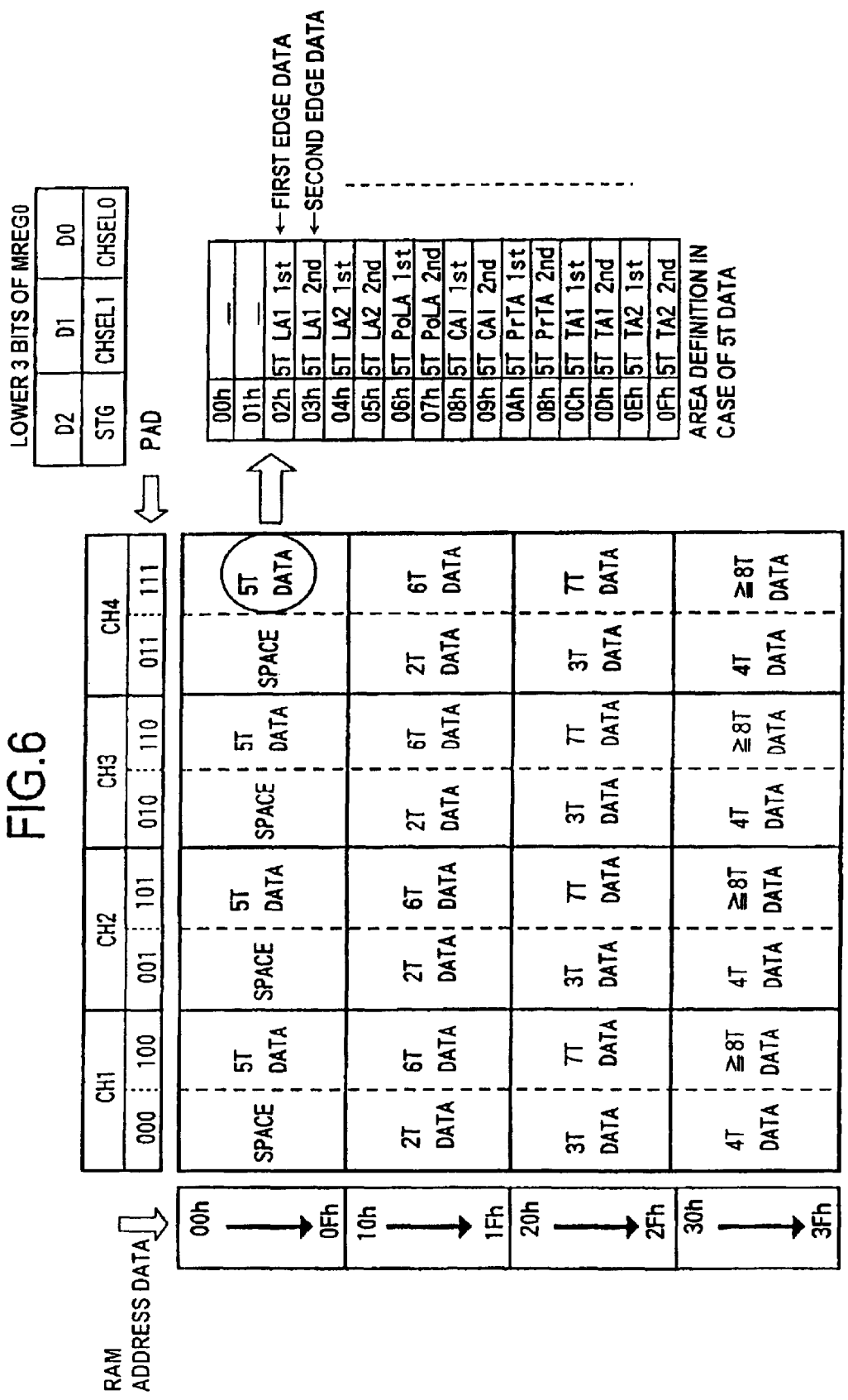
FIG. 6 is a view of an array of RAM data at the time of a first strategy mode.
Figure 7:
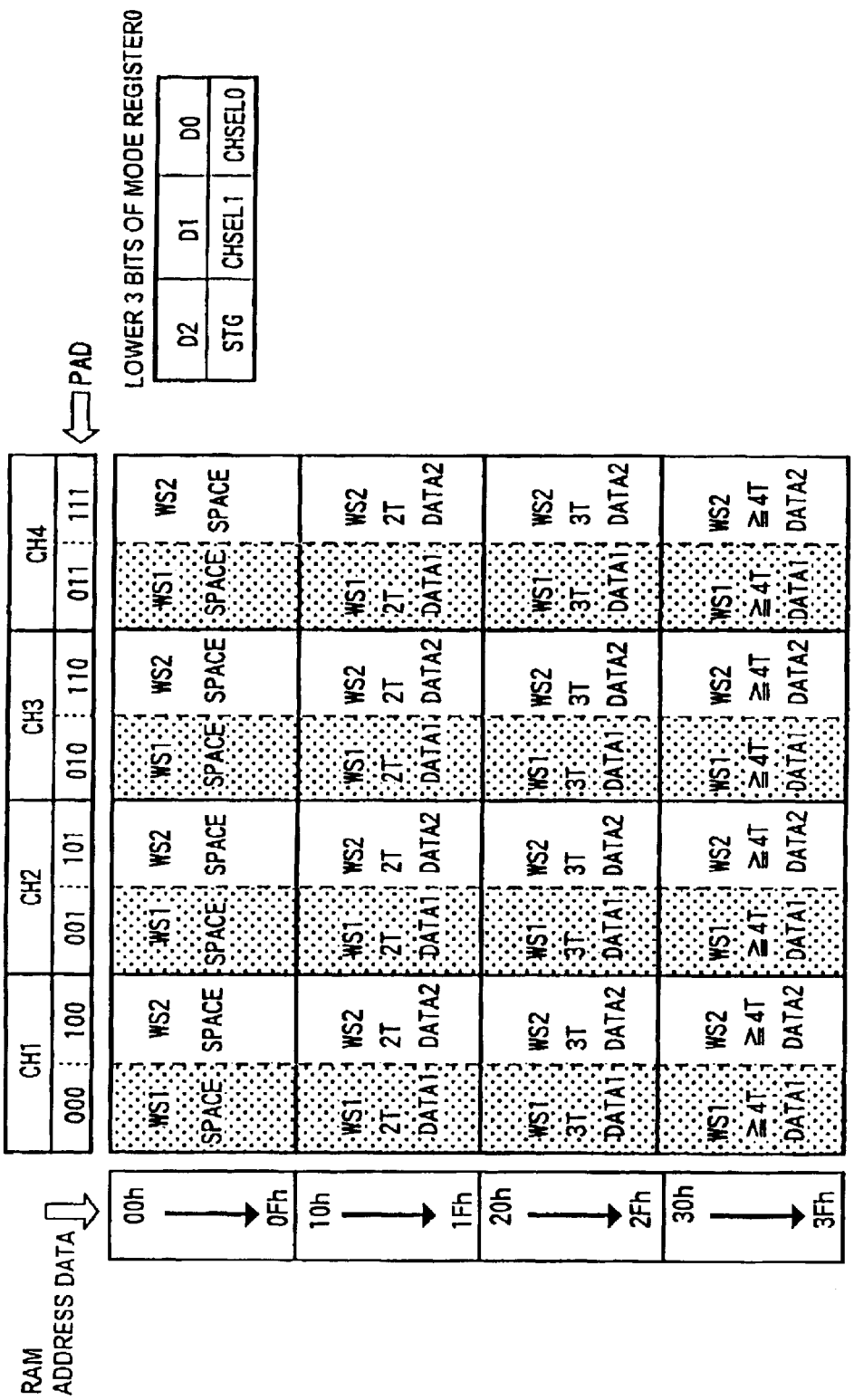
FIG. 7 is a view of an array of RAM data at the time of a second strategy mode.

FIG. 6 is a view of an array of RAM data at the time of the first strategy mode, while FIG. 7 is a view of an array of RAM data at the time of the second strategy mode.

In the first strategy mode, it is possible to output any waveform data for a 2T~≧8T mark length. As shown in FIG. 6, waveform data corresponding to 2T~≧8T are written into every channel CH1 to CH4.

Further, in the second strategy mode, it is possible to output any waveform data for a 2T~≧4T mark length. As shown in FIG. 7, the number of pulse patterns which can be set becomes half, but it is possible to write two types of pulse patterns for every channel CH1 to CH4 and to reduce th e communication time by writing data in the RAM beforehand.

Further, as shown in FIG. 6 and FIG. 7, page address data PAD is designated by the lower 3 bit s of th e mode register MREG0 in the mode register unit 10.

FIGS. 8(A) to (H) are views of an example of the data configuration in the first strategy mode, and FIGS. 9(A) to (H) are views of an example of the t data configuration in the second strategy mode.

In FIGS. 8(A) to (G) and FIGS. 9(A) to (G), LA1 indicates "Leading Area 1", LA2 indicates "Leading Area 2", PoLA indicates "Post Leading Area", CA indicates "Central Area", PrTA indicates "Pre Trailing Area", TA1 indicates "Trailing Area 1", and TA2 indicates "Trailing Area 2".

In the waveform data in the present example, two to eight strings of pulse waveform data are allocated for a 2T to 8T mark length and one string each of waveform data is allocated before and after the same to form the waveform data for each mark length. That is, for example, if the mark length is 2T, four strings of pulse waveform data and if the mark length is 5T, seven strings of pulse waveform data are used to form the waveform data.

In FIGS. 8(A) to (C) and FIGS. 9(A) to (C), the portion where the waveform is "H" shows pulse waveform data for the mark length.

Further, the notations attached to the pulse waveform data for the mark length and pulse waveform data before and after the same show individual setting data set for the pulse waveform data.

For example, the notations "2TLA2" and "2T TA1" are attached in order to the two strings of pulse waveform data forming a 2T mark length and the notations "2T LA1" and "2T TA2" are attached in order before and after the pulse waveform data.

Further, the notations "3T LA2", "2T PoLA", and "3T TA1" are attached in order to three strings of pulse waveform data forming a 3T mark length and the notations "3T LA1" and "3T TA2" are attached in order before and after the pulse waveform data.

It is shown that pulse waveform data differentiated by these notations have unique setting data.

Note that identical notations show pulse waveform data of identical contents. In particular, long mark length data have a structure repeatedly using identical data "6T CA" and "7T CA" at the middle part of the mark.

Further, each waveform data is configured to specify each pulse waveform by data of the rising edge position and falling edge position and the polarity.

For example, as shown in FIG. 6, each pulse waveform is specified by writing the first edge data and the second edge data to reach area.

Here, the rising edge position and the falling edge position, when expressing the maximum pulse width by n number of bits, are data specifying the rising edge bit and the falling edge bit among the n bits. For example, when using a resolution where the maximum pulse width can be represented by 32 bits, one bit among the 32 bits is specified to show the position of the rising edge position or the falling edge position of the pulse signal. 32 bits of data can be expressed by 5 bits of binary data at each of the rising edge position and falling edge position.

Further, the polarity of the pulse signal is represented by one bit of binary data.

Therefore, in this case, each pulse waveform data is comprised of 5 bits+5 bits+1 data.

Such 11 bit-configuration waveform data are set in the memory areas allocated to the above notations "2T LA1" and "2T LA2".

The post leading area PoLA is present as an area in data of 3T or more, the pre-trailing area PrTA in 4T or more, and the central area CA in 5T or more. The central areas CA are increased one by one for 6T or more.

Figure 8:
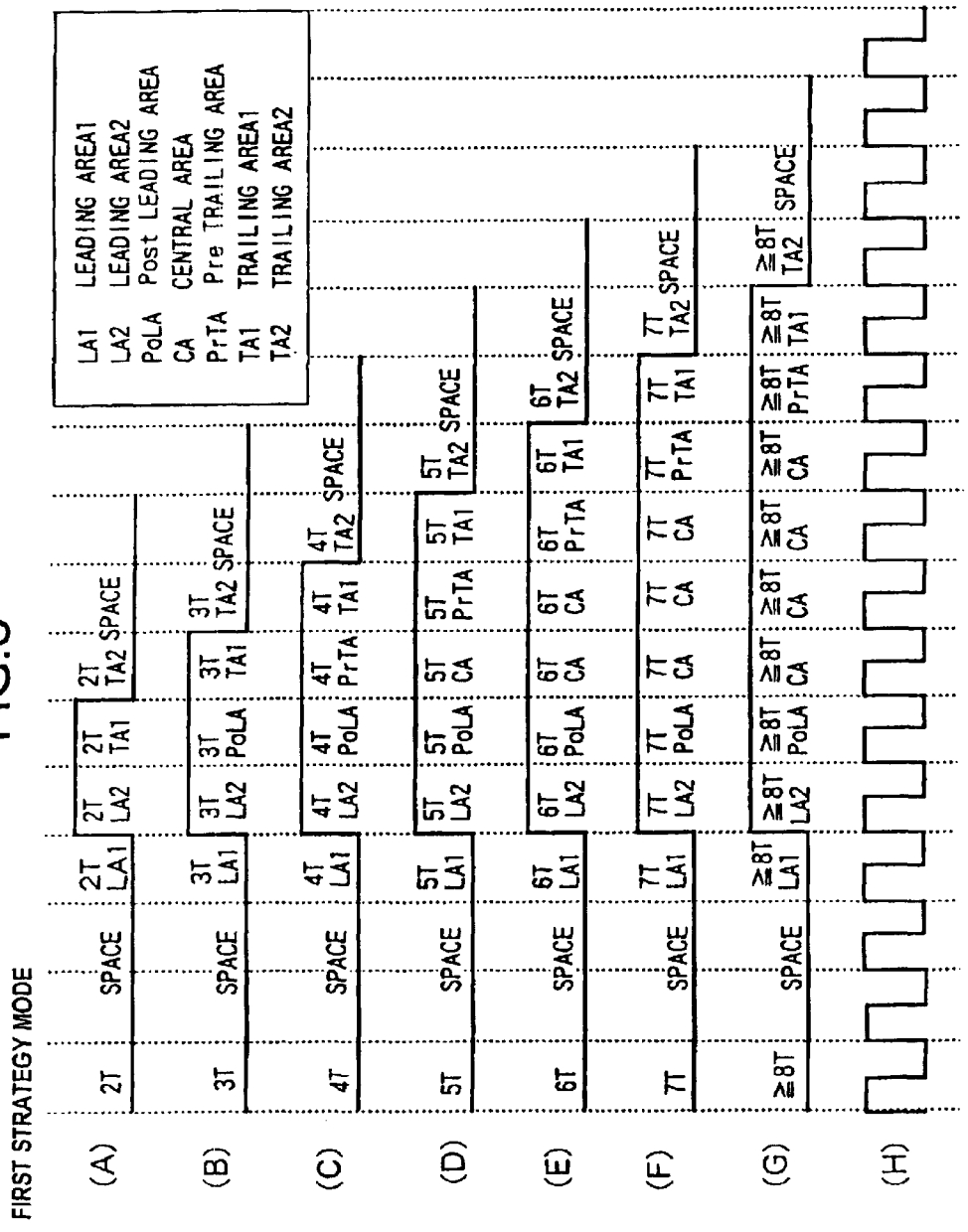
FIGS. 8(A) to (H) are views of an example of the configuration of data in a first strategy mode.
Figure 9:
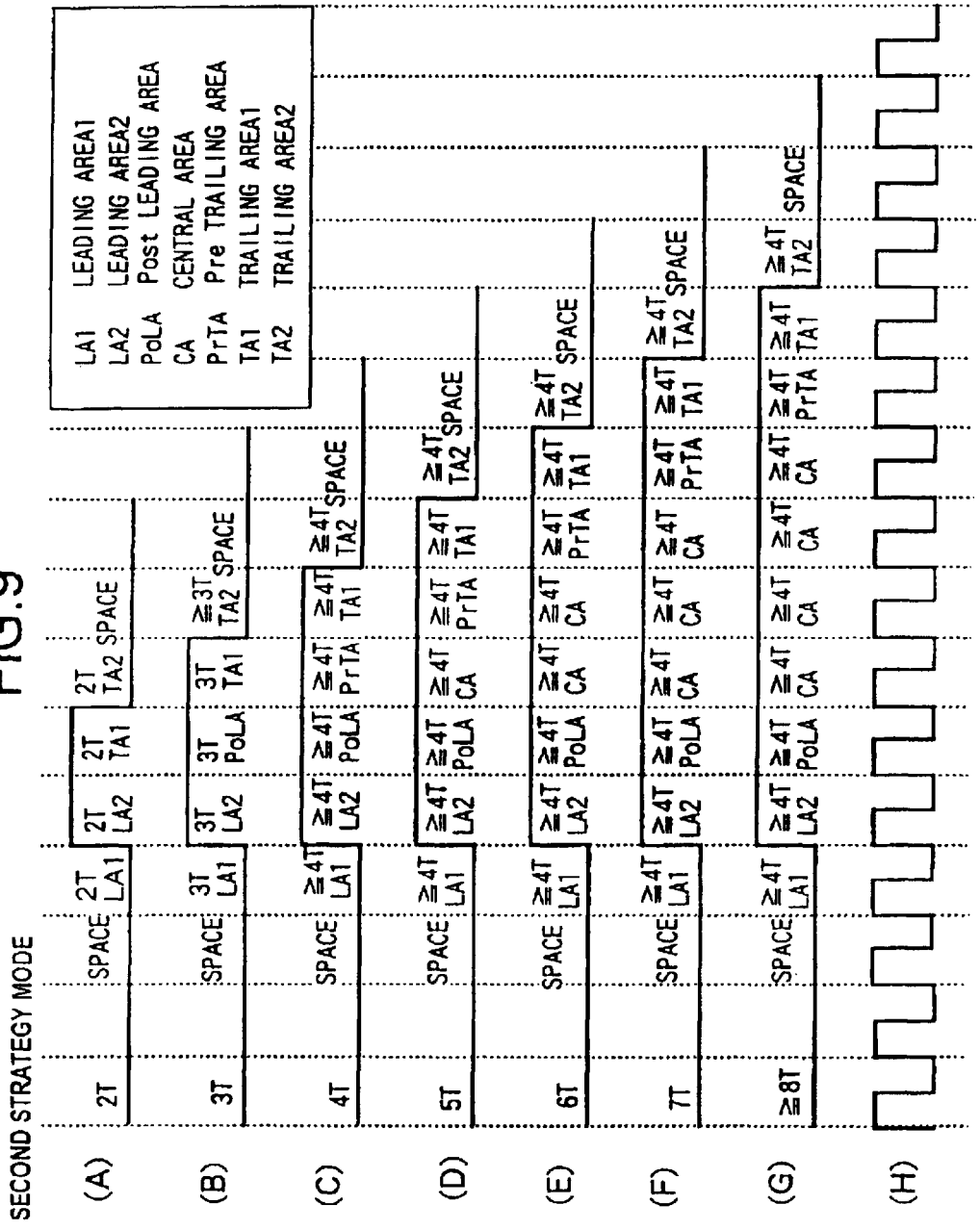
FIGS. 9(A) to (H) are views of an example of the configuration of data in a second strategy mode.

Further, as described above, the first strategy mode shown in FIG. 8 and the second strategy mode shown in FIG. 9 have different contents for mark lengths of 4T or more.

That is, in the first strategy mode shown in FIG. 8, waveform data are individually set for all mark lengths from 2T to 8T. A larger memory space is used to store the waveform data.

Since waveform data are set individually for all mark lengths from 2T to 8T, the drive of the LD light source 100 is controlled more finely.

On the other hand, in the second strategy mode shown in FIG. 9, the waveform data used for a 4T mark length are applied for mark lengths of 5T or more.

That is, waveform data expressed by the notations "≧4T LA1" and "≧4T LA2" allocated for the 4T mark length are utilized as is for waveform data of mark lengths of 5T or more. Namely, the notation "≧" attached at the head of each notation means use in common for waveform data of 4T or more.

By using the second strategy mode shown in FIG. 9, it is possible to conserve the memory area in the RAM 30.

Further, for example, in the case of an optical recording medium of a structure recording data by both lands and grooves, sometimes the optimal light source drive signal differs between the lands and the grooves. It becomes necessary to set the waveform data individually. Therefore, by using the second strategy mode shown in FIG. 9 to set different waveform data at the time of recording on the lands and at the time of recording on the grooves, it becomes possible to use an equivalent memory area as the case of the first strategy mode for control of the light source optimized for both land recording and groove recording.

The decoder (DEC) 40 converts the waveform data read from the RAM 30 to a pulse signal of parallel two-value data corresponding to the pulse waveforms.

For example, when the resolution can express a pulse width by 32 bits, if the polarity is positive, a parallel pulse signal having the bits from the head bit to the rising edge bit indicated by the pulse waveform data as "L", the bits from the rising edge bit to the falling edge bit as "L", and the bits from the falling edge bit to the last bit as "L" is output, while conversely if the polarity is negative, a parallel pulse signal having the bits from the head bit to the rising edge bit indicated by the pulse waveform data as "H", the bits from the rising edge bit to the falling edge bit as "L", and the bits from the falling edge bit to the last bit as "H" is output.

Note that up to here, the operation was based on the reference clock (channel clock) RCLK (CCLK).

The PLL circuit 50, for example, generates a clock signal synchronized in phase to a synchronization signal DCLK of the parallel signals DT0 to DT5 input to the address decoder 20 and supplies it to the 16-tap ring oscillator 60. The PLL circuit 50 includes a VCO (voltage controlled oscillator). For example, when six parallel signals are input as mentioned above, the VCO oscillates by 6 times the input frequency. Further, the PLL circuit 50 can be set in the lock range corresponding to the operation frequency.

The 16-tap ring oscillator 60 shifts the phase of the clock generated by the PLL circuit 50 and synchronized in phase to a reference clock so as to generate 32 types of phase shift pulse signals CK0 to CK31 shifted in phase by increments of $\frac{1}{32}$ (1/n) of the clock width from the reference clock by the differential outputs of the 16 taps and outputs these phase shift pulse signals CK0 to CK31 to the P/S conversion circuit 70. The pulse signal CK0 is supplied via a buffer BUF to the address encoder 20, the RAM 30, and the decoder 40.

Figure 10:
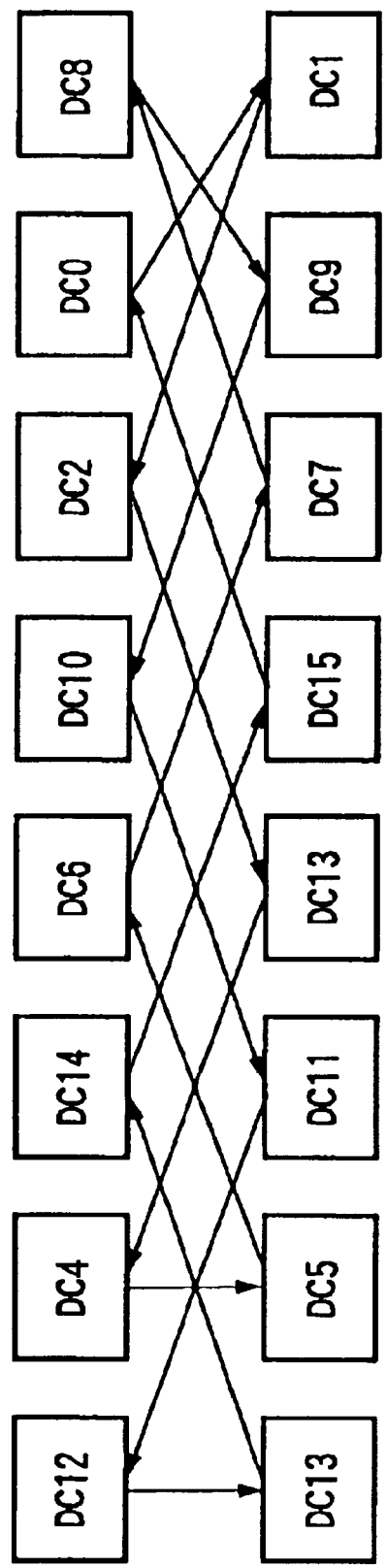
FIG. 10 is a view of an example of the layout for delay cells forming a 16-tap ring oscillator according to the present embodiment.

The 16-tap ring oscillator has, for example as shown in FIG. 10, 16 delay cells DC0 to DC15. In the present embodiment, to equalize the delay steps (equalize the interconnects), the layout shown in FIG. 10 is applied.

Concretely, as shown in FIG. 10, eight cells each are equally arranged in two stages. In the figure, the top stage has the even numbered notation delay cells DC12, DC4, D14, DC6, DC10, DC2, DC0, and DC8 arranged from the left side at substantially equal intervals, while the bottom stage has the odd numbered notation delay cells DC13, DC5, D11, DC3, DC15, DC7, DC9, and DC1 arranged from the left side at substantially equal intervals. The cells are connected by interconnects in order from DC0 to DC15. As a result, a ring-shaped oscillator is realized.

The delay cells DC0 to DC15 are differential type oscillators. The delay cells DC0 to DC15 output 32 types of phase shift pulses shifted in phase by increments of $\frac{1}{32}$.

Figure 11:
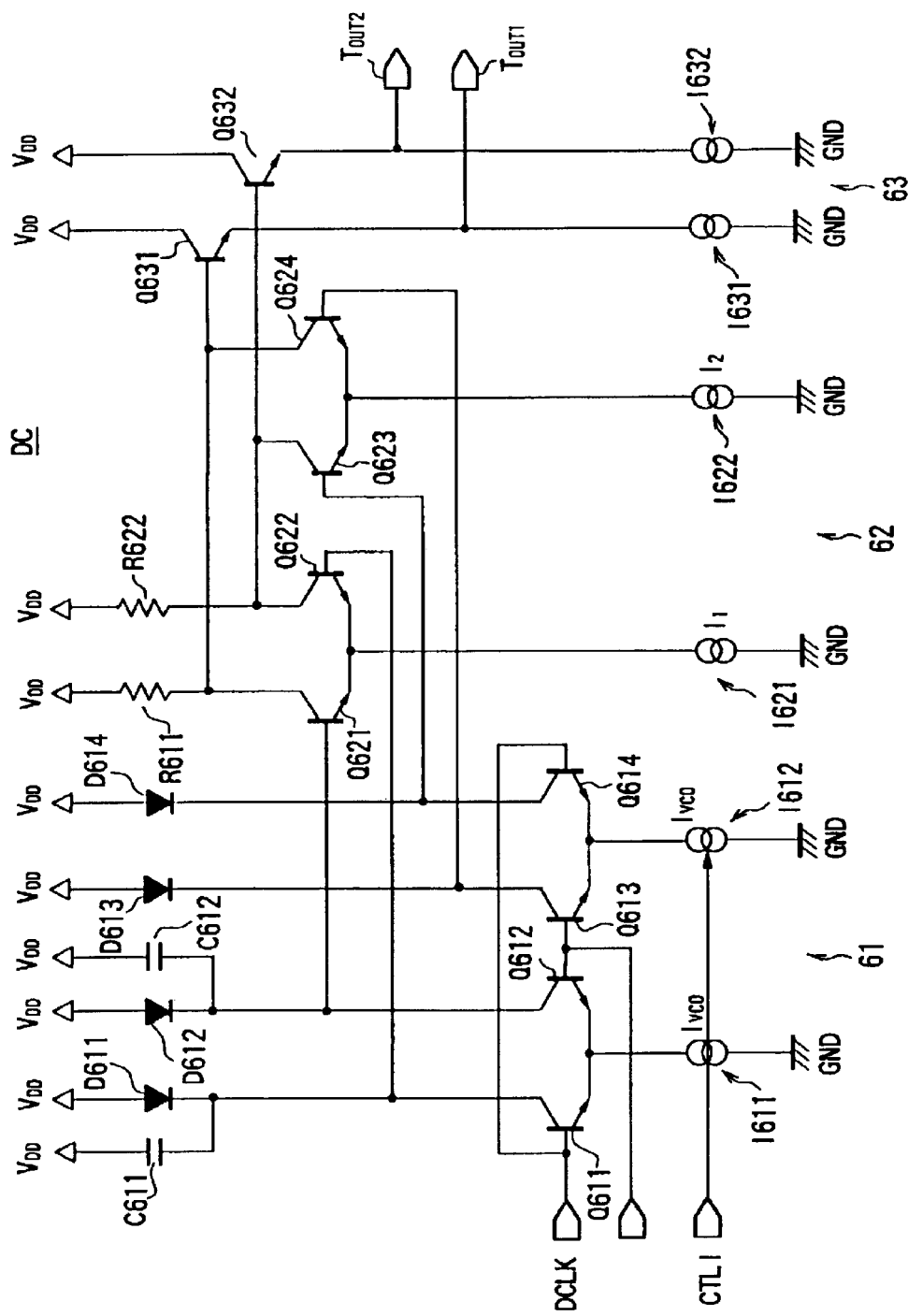
FIG. 11 is a view of a concrete example of the configuration of the 16-tap ring oscillator according to the present embodiment.

FIG. 11 is a circuit diagram of the concrete configuration of a delay cell DC (0 to 15) according to the present embodiment.

The delay cell DC has a cascade-connected delay controller 61, a mixed amplifier 62, and an output portion 63.

The delay controller 61 has npn-transistors Q611 to Q614, variable current sources I611 and I612, diodes D611 to D614, and capacitors C611 and C612.

Emitters of the transistors Q611 and Q612 are connected, and the connection point is connected to the current source I611. Emitters of the transistors Q613 and Q614 are connected, and the connection point is connected to the current source I612. Bases of the transistor Q611 and Q614 are connected to an input line of a clock DCLK, and bases of the transistors Q612 and Q613 are connected to an input line of a clock CKK.

A collector of the transistor Q611 is connected to a first electrode of the capacitor C611 and a cathode of the diode D611, while a second electrode of the capacitor C611 and an anode of the diode D611 are connected to a supply line of a power supply voltage $V_{DD}$. A collector of the transistor Q612 is connected to a first electrode of the capacitor C612 and a cathode of the diode D612, while a second electrode of the capacitor C612 and an anode of the diode D612 are connected to the supply line of the power supply voltage $V_{DD}$. A collector of the transistor Q613 is connected to a cathode of the diode D613, while an anode of the diode D613 is connected to the supply line of the power supply voltage $V_{DD}$. A collector of the transistor Q614 is connected to an cathode of the diode D614, while an anode of the diode D614 is connected to the supply line of the power supply voltage $V_{DD}$.

The delay controller 61 is configured so that it can control the amount of delay by controlling the current $I_{VCO}$ of the current sources I611 and I612 with a control signal CTLI.

The mixed amplifier 62 has npn-transistors Q621 to Q624, current sources I621 and I622, and resistors R621 and R622.

Emitters of the transistors Q621 and Q622 are connected, and the connection point is connected to the current source I621. Emitters of the transistors Q623 and Q624 are connected, and the connection point is connected to the current source I622.

A base of the transistor Q621 is connected to a collector of the transistor Q612, a base of the transistor Q622 is connected to a collector of the transistor Q611, a base of the transistor Q623 is connected to a collector of the transistor Q614, and a base of the transistor Q624 is connected to a collector of the transistor Q613.

Further, the collectors of the transistors Q621 and Q624 are connected, and the connection point is connected to the supply line of the power supply voltage $V_{DD}$ via the resistor R612.

That is, the mixed amplifier amplifies four differential outputs of the delay controller 61, mixes the same two by two, and supplies the results to the output portion 63.

In the mixed amplifier 62, a ratio between a current I1 of the current source I621 and a current I2 of the current source I622 is set to I1:I2=1:1 or I1:I2=0.4:1.6 etc. A higher band of the control range is realized by switching the mixing ratios.

The output portion 63 has npn-transistors Q631 and Q632 and current sources I631 and I632.

A base of the transistor Q631 is connected to collectors of the transistors Q621 and Q624, a collector is connected to the supply line of the power supply voltage $V_{DD}$, an emitter is connected to the current source I631, and the connection point is connected to an output terminal Tout1. A base of the transistor Q632 is connected to collectors of the transistors Q622 and Q623, a collector is connected to the supply line of the power supply voltage $V_{DD}$, an emitter is connected to the current source I632, and the connection point is connected to an output terminal Tout2.

That is, the output portion 63 has an emitter-follower output stage configuration.

The P/S conversion circuit 70 generates a fine width pulse from the phase difference of two phase shift pulses among the phase shift pulses CK0 to CK31 shifted by the oscillator 60 based on the two pulses, converts the generated plurality of fine width pulses to a serial pulse signal by serially adding the parallel two-value signals from the decoder 40, and outputs the same to the output circuit 80.

Further, the output circuit 80 performs necessary processing such as amplification and impedance matching on the serial signal from the P/S conversion circuit 70 and outputs the result to the light source driver 90.

Note that, in the present embodiment, as mentioned above, there are eight systems of output.

This is because, for example, a plurality of systems is provided in the configuration from the RAM 30 on so as to generate separately pulse signals with different levels such as an erase level (Erase) and a peak level (Peak) shown in FIG. 2 and mix them at the later light source driver 90 or so as to perform waveform processing of a lower resolution than the above 32-bit resolution. These are suitably selected and used.

The P/S conversion circuit 70 prepares fine width pulses having 1/32 pulse widths based on such 32 types of phase shift pulses shifted in phase by increments of 1/32 and uses the fine width pulses to convert parallel signals to a serial signal.

Figure 12:
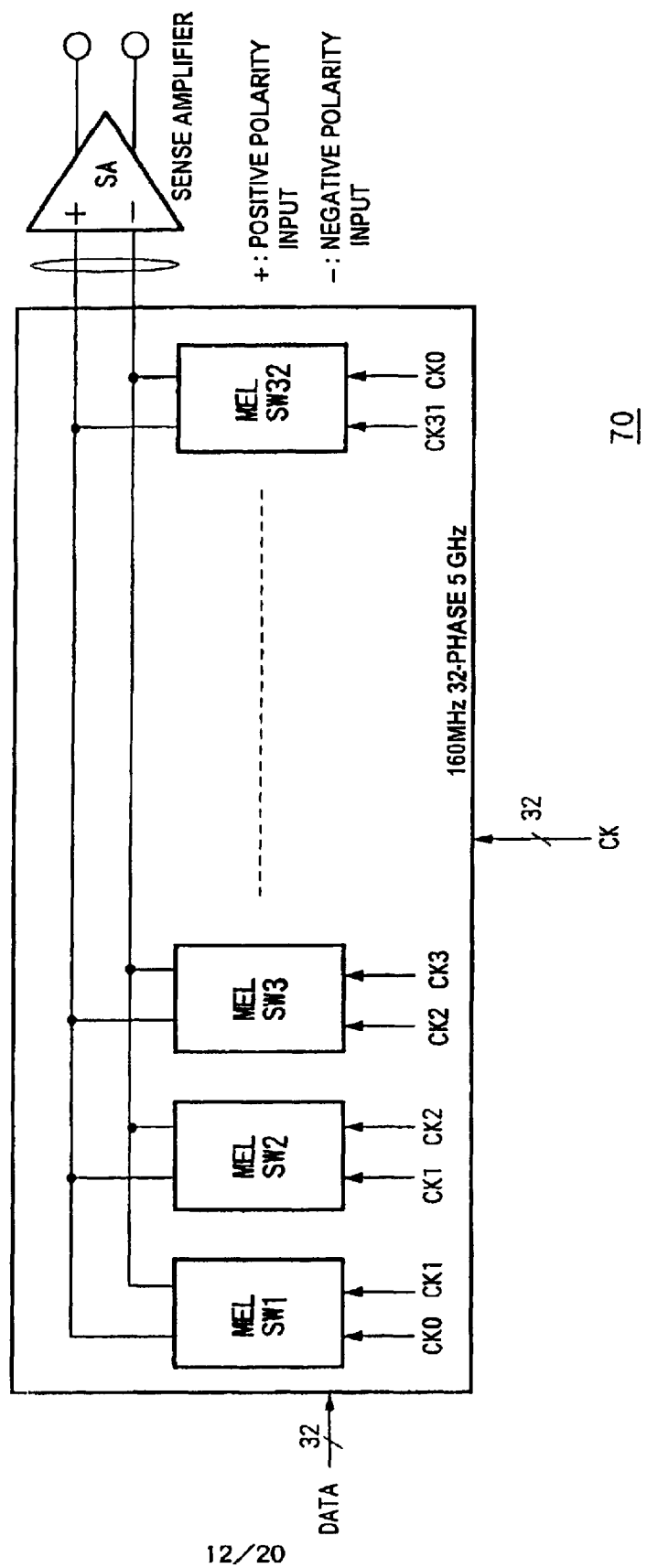
FIG. 12 is a block diagram of the configuration of a P/S conversion circuit of an optical recording apparatus shown in FIG. 1.

FIG. 12 is a block diagram of the configuration of the P/S conversion circuit according to the present embodiment.

As shown in FIG. 12, the P/S conversion circuit 70 has 32 MEL (multi-level emitter logic) switch circuits SW1 to SW32 and an adder SA (sense amplifier) which adds the outputs from the MEL switch circuits SW1 to SW32.

The MEL switch circuits SW1 to SW32 receive as input two adjacent phase shift pulses (for example, CK0 and CK1, CK1 and CK2, CK2 and CK3, . . . ) among the phase shift pulses CK0 to CK31 and obtain the differences of the two phase shift pulses so as to output the above-mentioned 1/32 fine width pulses.

Further, two outputs are prepared for the outputs of the MEL switch circuits SW1 to SW32. In accordance with the above-mentioned pulse waveform data, fine width pulses are selectively output to a positive polarity input side (+) or a negative polarity input side (−) of the adder SA. These fine width pulses are added by the adder SA where the fine width pulses are serially connected, whereby a serial signal corresponding to the pulse waveform data is output.

Figure 13:
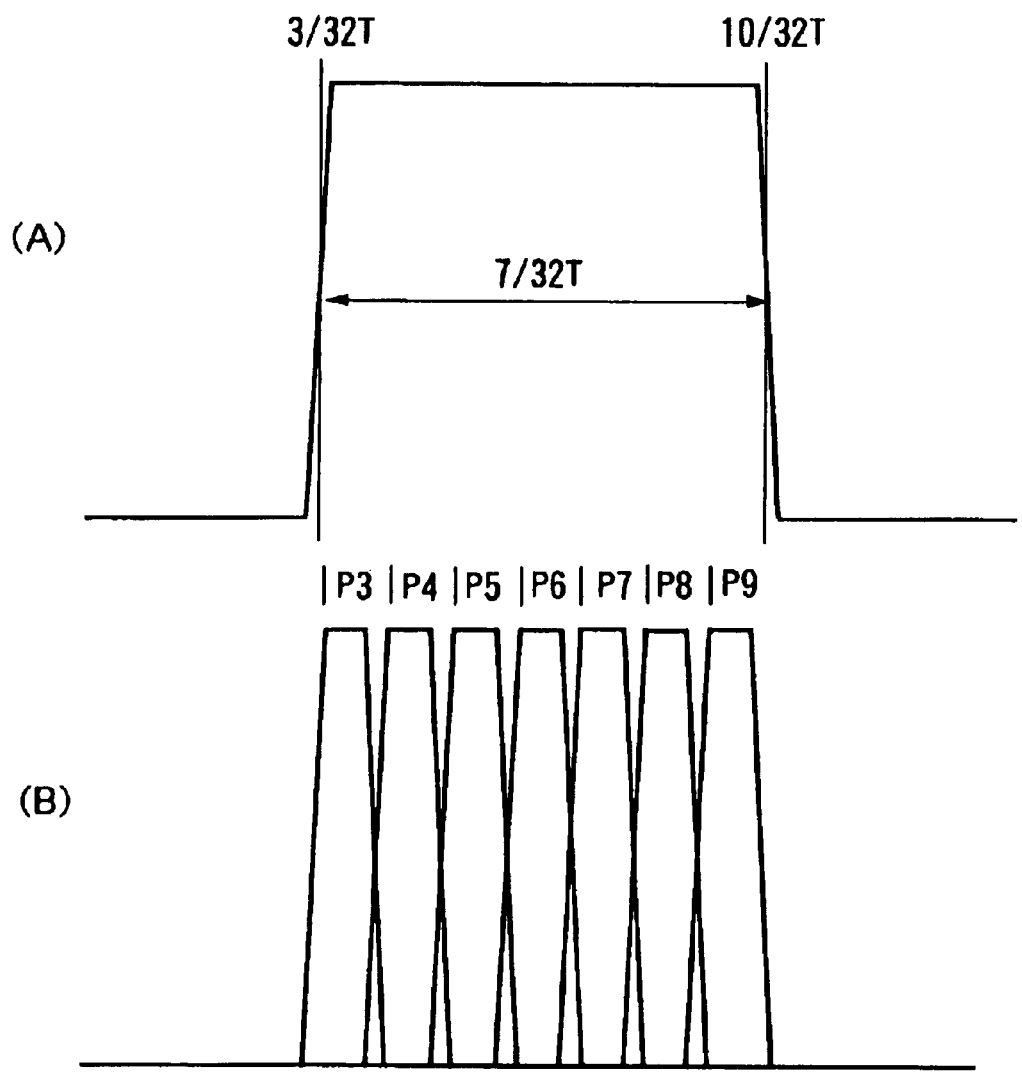
FIGS. 13(A) and (B) are explanatory views of an example of a serial signal comprised of fine width pulses serially connected and output in the P/S conversion circuit shown in FIG. 12.

FIG. 13 is an explanatory view of an example of a serial signal obtained by serially connecting these fine width pulses.

The example illustrated, as shown in FIG. 13(B), shows a case in which seven fine width pulses are output from a third MEL switch circuit SW3 to a ninth MEL switch circuit SW9 to the positive polarity input side of the adder SA. These successive seven fine width pulses are serially added by the adder SA. As shown in FIG. 13(A), a positive polarity pulse waveform signal having a pulse width 7/32T which rises at a timing of 3/32T and falls at a timing of 10/32T is output.

Figure 14:
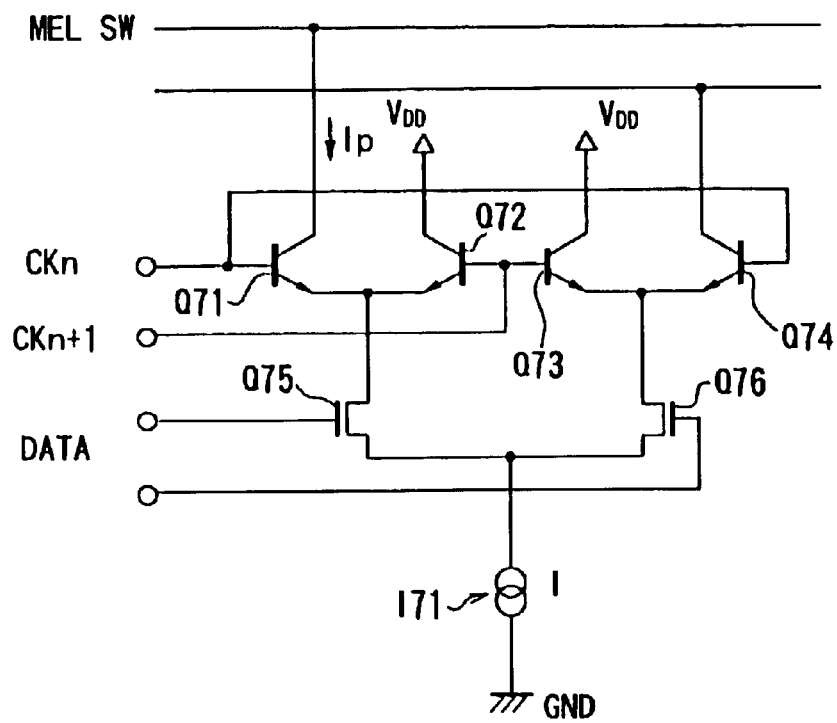
FIG. 14 is a block diagram of the circuit configuration of an MEL switch circuit provided in the P/S conversion circuit shown in FIG. 12.

FIG. 14 is a block diagram of the circuit configuration of a MEL switch circuit, while FIG. 9 is an explanatory view of the content of the signal processing in a MEL switch circuit.

As shown in FIG. 14, the MEL switch circuit has two differential amplifiers comprised of pairs of npn-transistors Q71, Q72 and Q73, Q74, a constant current source I71 connected in common to the emitters of the transistors Q71, Q72, Q73, and Q74, and NMOS-transistors Q75 and Q76 selectively connecting either of the two differential amplifiers to the constant current source I71 in accordance to the above-mentioned waveform data (DATA).

Among the above-mentioned two phase shift pulses CKn and CKn+1, the phase shift pulse CKn is supplied to the bases of the transistors Q71 and Q74 of the differential amplifers, while the phase shift pulse CKn+1 is supplied to the bases of the transistors Q72 and Q73 of the two differential amplifiers.

Figure 15:
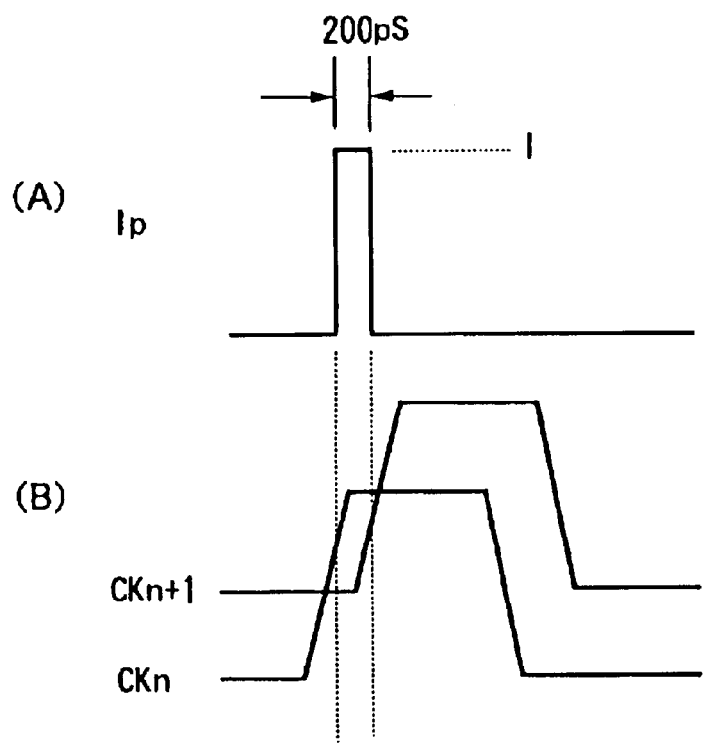
FIGS. 15(A) and (B) are views for explaining signal processing content in the MEL switch circuit shown in FIG. 14.

The phase shift pulses CKn and CKn+1 are, as shown in FIG. 15(B), changed in level by a later explained buffer circuit provided at the input stage and are input as phase shift pulses having a constant level difference from each other.

Further, the transistors Q71 and Q72 of one differential amplifier subtract the low-level phase shift pulse CKn from the high-level phase shift pulse CKn+1, whereby a fine width pulse due to the level difference (200 psec pulse width in the example of FIG. 14(A)) is output as the collector current IP of the transistor Q71.

Further, the transistors Q73 and Q74 of the other differential amplifier, like the transistors Q71 and Q72, subtract the low-level phase shift pulse CKn from the high-level phase shift pulse CKn+1, whereby a fine width pulse due to the level difference is output as the collector current IP of the transistor Q74.

Further, either of the MOS transistors Q75 and Q76 turns on based on the waveform data (including polarity data) from the decoder 40. By connecting either differential amplifier to the constant current source I, the operations of the differential amplifiers are executed selectively corresponding to the waveform data.

Figure 16:
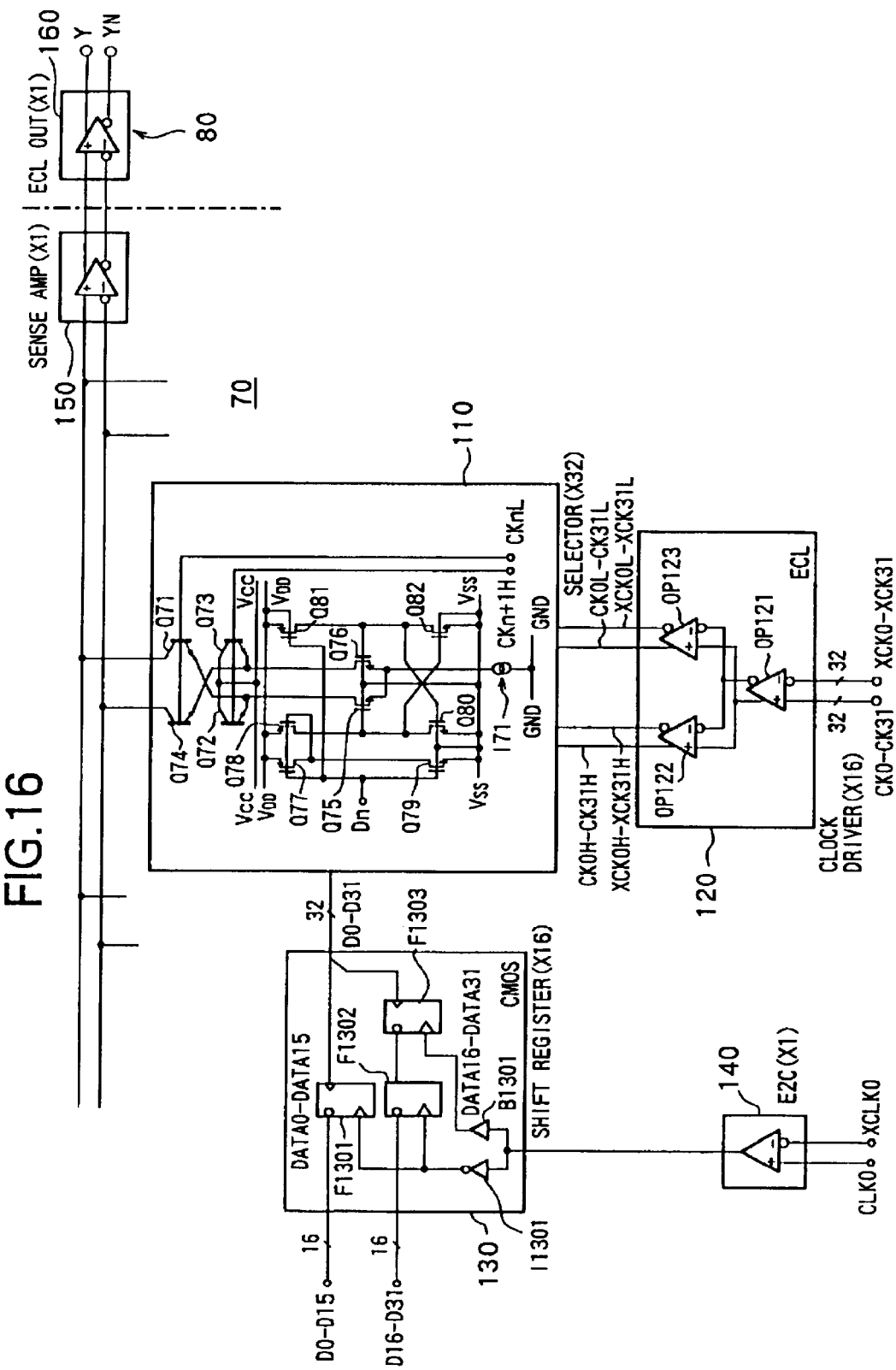
FIG. 16 is a circuit diagram of a detailed example of the configuration of the MEL switch circuit and its peripheral circuits.

FIG. 16 is a circuit diagram of a detailed example of the configuration of a MEL switch circuit and its peripheral circuits.

In the figure, the transistors Q71 to Q76, the current source I71, etc. of the above-mentioned MEL switch circuit are provided in a selector 110. The selector 110 is provided around it with a clock driver 120, a shift register 130, a buffer 140, etc. Note that the selector 110 has MOS transistors Q77 to Q82 for conveying data to the MOS transistors Q75 and Q76 at predetermined levels connected serially and/or in parallel between the supply line of the power supply voltage $V_{DD}$ and the reference potential $V_{SS}$ and is configured so that a signal of the power supply voltage $V_{DD}$ level or reference potential level is supplied to the gates of the MOS transistors Q75 and Q76.

The output line is provided with the sense amplifier 150 forming the adder SA. The output signal from the sense amplifier 150 is sent to an ECL output amplifier 160 of the output circuit 80.

Figure 17:
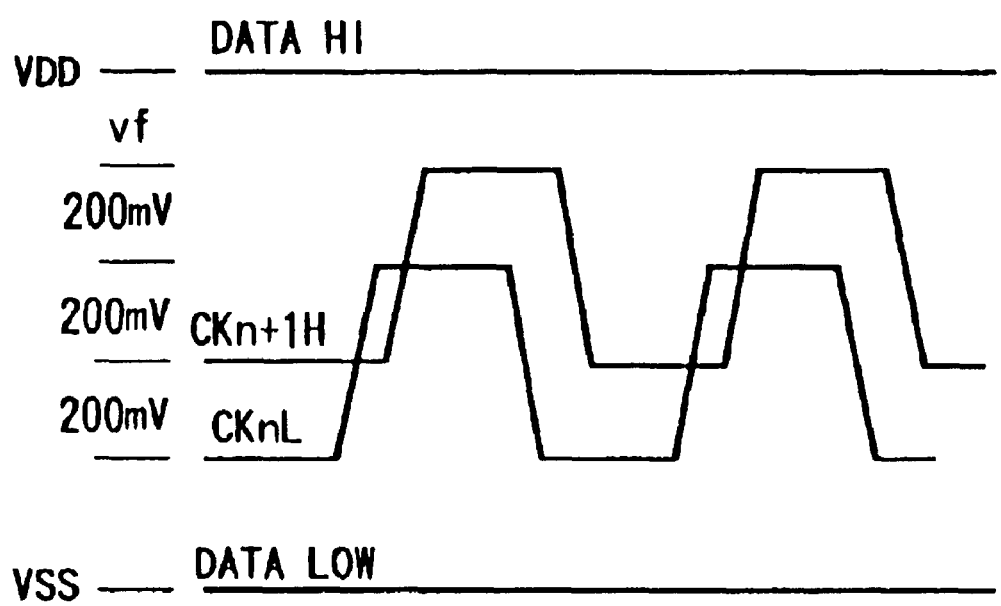
FIG. 17 is a view of a level-changed clock waveform.

The clock driver 120 has, as shown in FIG. 16, operational amplifiers OP121 to OP123. It receives the above-mentioned phase shift pulses at the operational amplifier OP121, converts them in level at the operational amplifiers OP122 and OP123 as shown in FIG. 17, and supplies the results to the selector 110.

Figure 18:
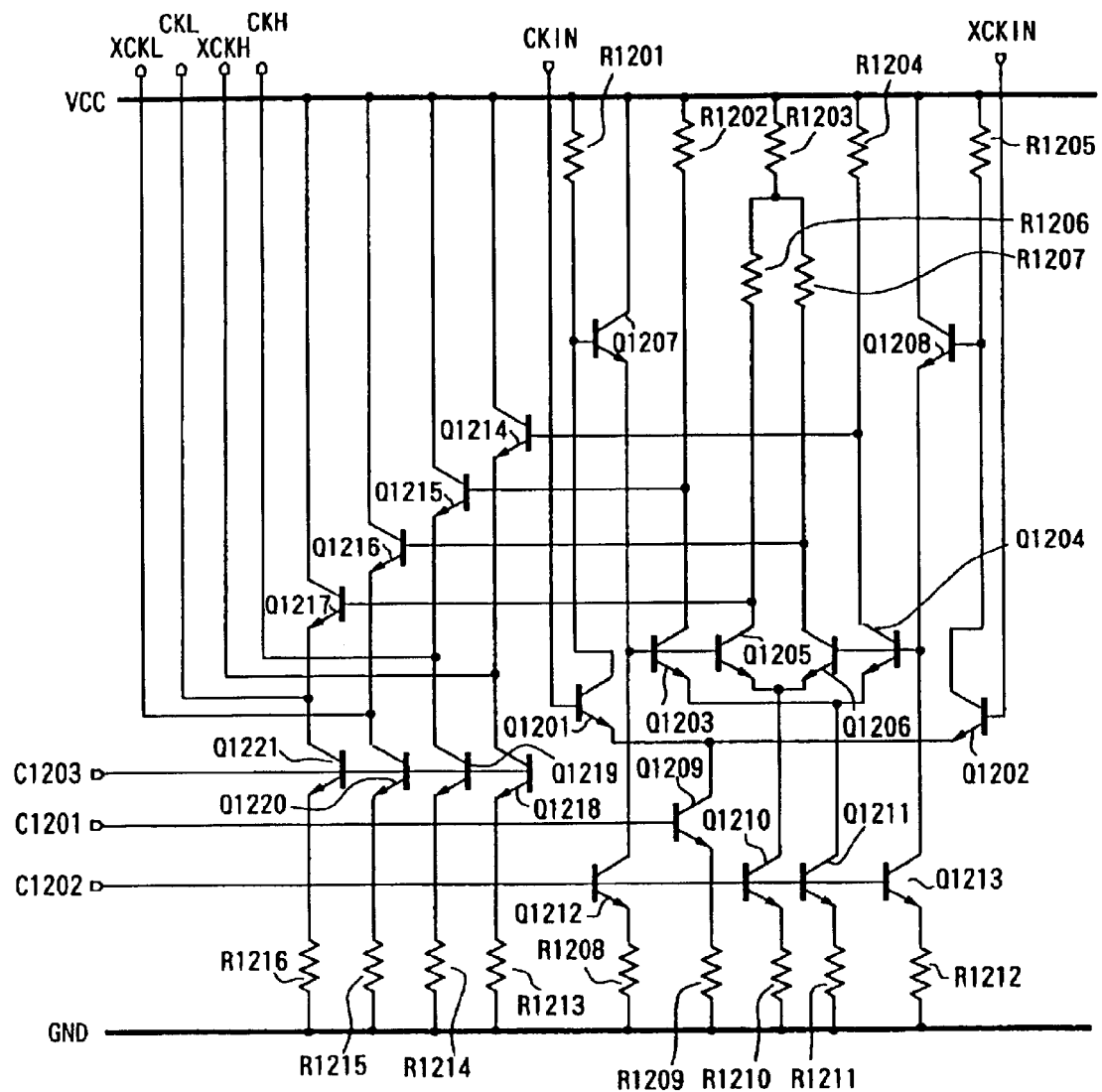
FIG. 18 is a circuit diagram of a concrete example of the configuration of a clock driver in FIG. 16.
Figure 19:
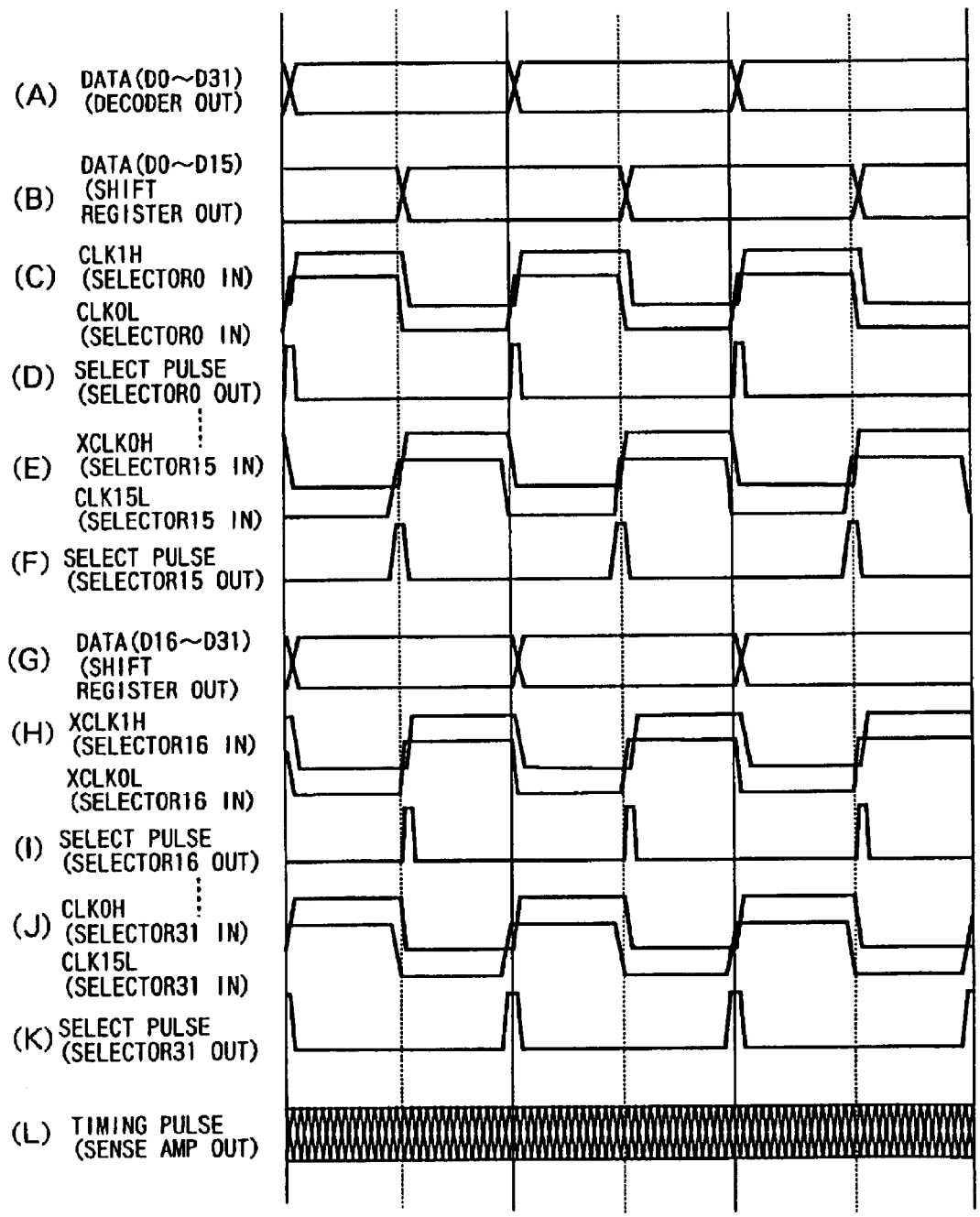
FIGS. 19(A) to (L) are timing charts of processing for generating the fine width pulses in the P/S conversion circuit shown in 16.

FIG. 18 is a circuit diagram of a concrete example of the configuration of the clock driver 120.

The clock driver 120, as shown in FIG. 18, has npn-transistors Q1201 to Q1221 and resistors R1201 to R1216.

Emitters of the transistors Q1201 and Q1202 are connected, the connection point is connected to a collector of the transistor Q1209 serving as a current source, and an emitter of the transistor Q1209 is grounded via the resistor R1209. A collector of the transistor Q1201 is connected to the supply line of the power supply voltage $V_{CC}$ via the resistor R1201 and is connected to a base of the transistor Q1207. Further, a collector of the transistor Q1207 is connected to the supply line of the power supply voltage $V_{CC}$, an emitter is connected to the bases of the transistors Q1203 and Q1205 and a collector of the transistor Q121 serving as a current source, and an emitter of the transistor Q1212 is grounded via the resistor R1208. A collector of the transistor Q1202 is connected to the supply line of the power supply voltage $V_{CC}$ via the resistor R1205 and is connected to the base of the transistor Q1208. Further, a collector of Q1208 is connected to the supply line of the power supply voltage $V_{CC}$, an emitter is connected to bases of the transistors Q1204 and Q1206 and is connected to a collector of the transistor Q1213 serving as a current source, and an emitter of the transistor Q1213 is grounded via the resistor R1212. Further, a base of the transistor Q1209 serving as a current source is connected to the supply line of a control signal C1201, and bases of the transistors Q1212 and Q1213 similarly serving as current sources are connected to a supply line of a control signal C1202.

Further, a base of the transistor Q1201 is connected to an input line of the phase shift clock CK, and a base of the transistor Q1202 is connected to an input line of the phase shift clock XCK.

The transistors Q1201, Q1202, Q1209, Q1212, and Q1213 and the resistors R1201, R1205, R1208, R1209, and R1212 constitute the input stage operational amplifier OP121.

Emitters of the transistors Q1203 and Q1204 are connected, the connection point is connected to a collector of the transistor Q1211 serving as a current source, and an emitter of the transistor Q1211 is grounded via the resistor R1211. A collector of the transistor Q1203 is connected to the supply line of the power supply voltage $V_{CC}$ via the resistor R1202 and connected to the base of the transistor Q1215. Further, a collector of the transistor Q1215 is connected to the supply line of the power supply voltage $V_{CC}$, an emitter is connected to a collector of the transistor Q1219 serving as a current source, and an emitter of a transistor Q1219 is grounded via the resistor R1214. A collector of the transistor Q1204 is connected to the supply line of the power supply voltage $V_{CC}$ via the resistor R1204 and is connected to a base of the transistor Q1214. Further, a collector of Q1214 is connected to the supply line of the power supply voltage $V_{CC}$, an emitter is connected to a collector of the transistor Q1218 serving as a current source, and an emitter of the transistor Q1218 is grounded via the resistor R1213. Further, a base of the transistor Q1211 serving as a current source is connected to a supply line of a control signal C1202 and bases of the transistors Q1218 and Q1219 similarly serving as current sources are connected to a supply line of a control signal C1203.

The transistors Q1203, Q1204, Q1211, Q1214, and Q1215 and the resistors R1202, R1204, R1211, R1213, and R1214 constitute the high level output stage operational amplifier OP122.

Emitters of the transistors Q1205 and Q1206 are connected, the connection point is connected to a collector of the transistor Q1210 serving as a current source, and an emitter of the transistor Q1210 is grounded via the resistor R1210. A collector of the transistor Q1205 is connected to one end of the resistor R1206, and the other end of the resistor R1206 is connected to the supply line of the power supply voltage $V_{CC}$ via the resistor R1203 and is connected to the base of the transistor Q1217. Further, a collector of Q1217 is connected to the supply line of the power supply voltage $V_{CC}$, an emitter is connected to a collector of the transistor Q1221 serving as a current source, and an emitter of the transistor Q1221 is grounded via the resistor R1216. A collector of the transistor Q1206 is connected to one end of the resistor R1207, and the other end of the resistor R1207 is connected to the supply line of the power supply voltage $V_{CC}$ via the resistor R1203 and is connected to a base of the transistor Q1216. Further, the collector of Q1216 is connected to the supply line of the power supply voltage $V_{CC}$, an emitter is connected to a collector of the transistor Q1220 serving as a current source, and an emitter of the transistor Q1220 is grounded via the resistor R1215. Further, a base of the transistor Q1210 serving as a current source is connected to the supply line of the control signal C1202, and bases of the transistors Q1220 and Q1221 similarly serving as current sources are connected to the supply line of the control signal C1203.

The transistors Q1205, Q1206, Q1210, Q1216, Q1217, Q1220, and Q1221 and resistors R1203, R1206, R1207, R1210, R1215, and R1216 constitute the low-level output stage operational amplifier OP123.

Further, the shift register 130 has flip-flops FF1301 to FF1303, an inverter 11301, and a buffer B1301 and performs phase shift processing on the 32 strings of waveform data "data0" to "data31" (D0 to D31) based on the reference clock from the buffer 140.

In the present example, to process reliably a high frequency signal in the P/S conversion circuit 70, as shown in FIG. 18, the 32 strings of waveform data "data0" to "data31" are divided into 16 strings each, that is, D0 to D15 and D16 to D31, and signal processed by P/S conversion in states shifted in phase by ½ clock and 1 clock respectively. The shift register 130 shifts the phases of D0 to D15 and D16 to D31 differently and supplies the results to the selector 110.

FIGS. 19(A) to (L) are timing charts of the processing in the P/S conversion circuit 70 generating these fine width pulses.

As shown in FIGS. 19(A) to (L), the P/S conversion circuit 70 obtains the difference of two adjacent phase shift pulses among the 32 types of phase shift pulses CK0 to CK31 to prepare 32 fine width pulses of 1/32 clock widths from the reference clock.

Then, it combines the 32 fine width pulses generated in this way to form a timing pulse and selectively combines the fine width pulses in accordance with the "H"s and "L"s of the parallel pulse signals corresponding to the waveform data being sent from the decoder 40 so as to output a serial signal corresponding to the pulse waveform data.

In this way, in the present example, high-speed processing becomes possible by fine width pulses created from a reference clock and therefore the load for speeding up a clock is lightened.

Next, the operation in FIG. 1 will be explained.

Note that, here, it is assumed that the RAM 30 stores waveform data corresponding to the first strategy mode and the second strategy mode based on setting data of the mode register unit 10.

At the time of an ordinary recording operation, recording data (NRZI), for example, parallel data signals DT0 to DT5, is input to the address encoder 20. The address encoder 20 converts the parallel data input at the rising edge timing of the clock signal DCLK to serial data.

The address encoder 20 judges the recording data (2T~≧8T or 2T~≧4T) converted to serial data and generates a read address Radr of the RAM 30 in which a pulse pattern corresponding to the mark length or space length indicated by the recording data is written. Then, the address encoder 20 outputs this to the RAM 30 together with the generated read clock RCLK.

In this way, the RAM 30 searches through a memory area based on the read address received from the address encoder 20, reads out the pulse waveform data corresponding to the mark length of the light source drive signal, and outputs it to the decoder 40.

Further, the PLL circuit 50 controls the 16-tap ring oscillator 60 so that for example a phase-synchronized clock signal of a frequency six times the synchronization signal DCLK of the parallel signals DT0 to DT5 being input to the address encoder 20 is generated at the oscillator 60.

The 16-tap ring oscillator 60 is controlled by the PLL circuit 50 and shifts the phase of the clock synchronized in phase with the reference signal. Due to this, it generates 32 types of phase shift pulse signals CK0 to CK31 shifted in phase by increments of ⅟₃₂ (1/n) of the clock width from the reference clock RCLK by the differential outputs of the 16 taps. Then, it outputs these phase shift pulses CK0 to CK31 to the P/S conversion circuit 70.

The P/S conversion circuit 70 generates fine width pulses from the phase difference of two phase shift pulses among the phase shift pulses CK0 to CK31 shifted by the oscillator 60 based on the two pulses. The P/S conversion circuit 70 further converts the generated plurality of fine width pulses to a serial pulse signal by serially adding the two-value signals of the parallel signals from the decoder 40 and outputs the result to the output circuit 80.

Further, the output circuit 80 performs the necessary signal processing such as amplification or impedance matching on the serial signal from the P/S conversion circuit 70 and outputs the result to the light source driver 90.

Further, the light source driver 90 drives the laser light source 100 in accordance with the input signal.

In this way, the P/S conversion circuit of the, present example can effectively convert fine width pulses obtained by a phase shift to a serial format without increasing the speed of the reference clock. Therefore, it becomes possible to realize a P/S conversion circuit featuring high speed and high accuracy processing without increasing the complexity of the circuit or the cost.

Further, by using such a P/S conversion circuit, it is possible to configure an optical recording apparatus controlling a laser driver for optical disk recording and it is possible to contribute to higher speed operation and higher accuracy of an optical disk apparatus improved in write strategy function.

Note that the above explanation was an example of the present invention. The concrete circuit configurations and values may be suitably modified.

Further, the shape of a light drive signal, the structure of the waveform data, etc. are not limited to the above example. They may be widely applied to various embodiments.

Further, the P/S conversion circuit is not limited in application to an optical recording apparatus. It may also be widely used for other electronics apparatuses.

Figure 20:
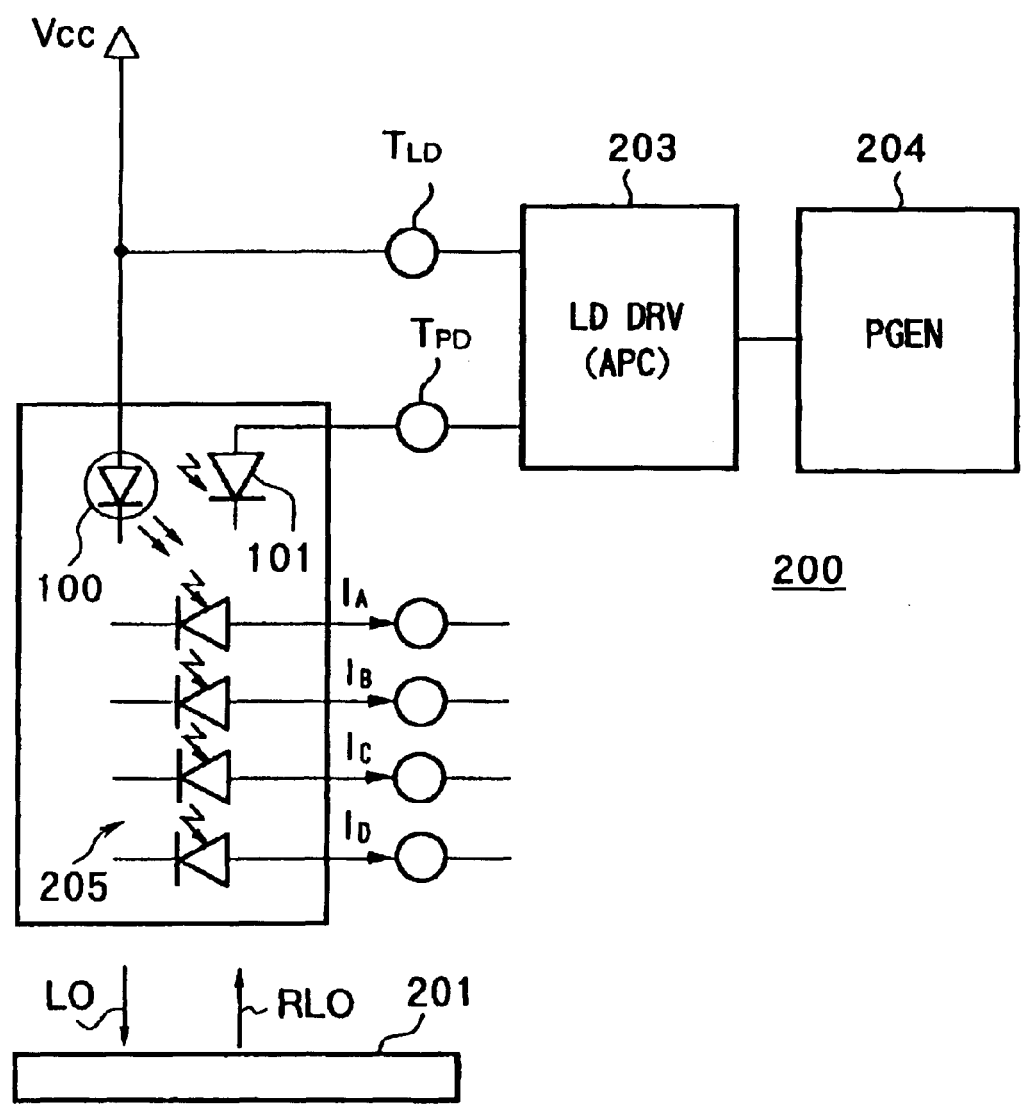
FIG. 20 is a circuit diagram of principal parts of an optical disk apparatus as an optical recording apparatus employing the light output control circuit according to the present invention.

FIG. 20 is a circuit diagram of principal parts of an optical disk apparatus as an optical recording apparatus using a light output control circuit according to the present invention.

In FIG. 20, an optical disk apparatus 200 has an optical disk medium 201, an optical pickup 202, a laser driver circuit (LDDRV) 203, and a pulse signal generation circuit (PGEN) 204. The optical pickup 202 has a laser diode (LD) 100 which emits laser light LO in accordance with the value of a drive current to the optical disk medium 201, a monitoring use photo detector (PD) 101 which receives the laser light LO emitted by the LD 100 and generates a monitor current corresponding to the received level, and a photo detector 205 which receives the reflected return light RLO of the laser light LO emitted to the optical disk medium 201 and generates a current of a value corresponding to the received level as main components.

The laser driver circuit 203 corresponds to the light source driver 90 in FIG. 1. The pulse signal generation circuit 204 includes the mode register (MREG), address encoder (AENC) 20, RAM (waveform data memory) 30, decoder (DEC) 40, PLL (Phase Locked Loop) circuit 50, 16-tap ring oscillator (OSC) 60 serving as a phase shifting means, parallel/serial (P/S) conversion circuit 70, and output circuit (OUTC) 80 of FIG. 1.

In this way, the light output control circuit 1 according to the present invention can be applied to an optical disk apparatus and enables a higher speed and higher accuracy of the optical disk apparatus.

As explained above, according to the present invention, since the phase of the reference clock pulse is shifted in increments of 1/n width of the pulse width, a fine width pulse is generated from a phase difference between two phase shift pulses among the phase shift pulses, the fine width pulses are added serially corresponding to an input of parallel signals, and a serial pulse signal is output, higher speed and higher accuracy of P/S conversion can be realized at a low cost without using a super high-speed clock.

Further, according to the present invention, when receiving as input parallel signals based on waveform data read from a waveform data memory corresponding to mark lengths to be recorded on the optical recording medium, converting these parallel signals to a serial signal by a parallel/serial conversion circuit, since the phase of the reference clock pulse is shifted in increments of 1/n width of the pulse width, a fine width pulse is generated from a phase difference between two phase shift pulses among the phase shift pulses, the fine width pulses are added serially corresponding to an input of parallel signals, and a serial pulse signal is output, higher speed and higher accuracy of P/S conversion can be realized at a low cost without using a super high-speed clock and waveform control of a pulse signal be output to the light source driver can be optimized for high speed and high accuracy.

Industrial Applicability

According to the parallel/serial conversion circuit, light output control circuit, and optical recording apparatus of the present invention, higher speed and higher accuracy of P/S conversion can be realized at a low cost without using a super high-speed clock and waveform control of a pulse signal being output to the light source driver can be optimized for high speed and high accuracy, so the present invention is suitable for an optical disk apparatus such as a phase change type optical disk and can be widely used for other electronics apparatuses.

What is claimed is:

1. A parallel/serial conversion circuit for converting parallel signals input to a serial pulse signal and outputting the same, comprising:

a phase shifting means for shifting a phase of a reference clock pulse by increments of 1/n width of a pulse width, a fine width pulse generating means for receiving as input two phase shift pulses among the phase shift pulses shifted by the phase shifting means and generating a fine width pulse from a phase difference between the two, and a serial signal generating means for serially adding the fine width pulses generated by said fine width pulse generating means corresponding to said parallel signal input and outputting a serial pulse signal.

2. A parallel/serial conversion circuit as set forth in claim 1, wherein said fine width pulse generating means generates said fine width pulse from two adjacent phase shift pulses among the phase shifted pulses shifted by said phase shifting means.

3. A parallel/serial conversion circuit as set forth in claim 1, wherein the circuit comprises a changing means for receiving as input two adjacent phase shift pulses among the phase shift pulses shifted by said phase shifting means and changing their levels to different levels, and said fine width pulse generating means generates said fine width pulse from the two phase shift pulses changed in level by said level changing means.

4. A parallel/serial conversion circuit as set forth in claim 1, wherein said phase shifting means includes a ring oscillator connecting a plurality of cells in a ring.

5. A parallel/serial conversion circuit as set forth in claim 1, wherein:

said phase shifting means includes a ring oscillator connecting a plurality of delay cells in a ring, and said plurality of delay cells are laid out so as to make delays cells which become odd-numbered stages and even-numbered stages when connected in a ring face each other and so that interconnects which connect them become approximately equal.

6. A light output control circuit which controls a light output of a light source for emitting predetermined data light to an optical medium, comprising:

a light source driver for driving the light source in response to said serial pulse signal and a parallel/serial conversion circuit for receiving as input parallel signals based on waveform data corresponding to data light to be emitted by said light source, converting said parallel signals to a serial pulse signal, and outputting the same to said light source driver, said parallel/serial conversion circuit comprising:

a phase shifting means for shifting a phase of a reference clock pulse by increments of 1/n width of a pulse width, a fine width pulse generating means for receiving as input two phase shift pulses among the phase shift pulses shifted by the phase shifting means and generating a fine width pulse from a phase difference between the two, and a serial signal generating means for serially adding the fine width pulses generated by said fine width pulse generating means corresponding to said parallel signal input and outputting a serial pulse signal.

7. A light output control circuit as set forth in claim 6, further comprising:

a waveform data memory for storing waveform data corresponding to data to be emitted by the light source, an accessing means for receiving as input the data to be emitted by the light source, judging the address of the waveform data memory corresponding to the input data, and accessing said waveform data memory, and a decoding means for decoding the waveform data read from the waveform data memory by said accessing means and outputting parallel signals which indicate the pulse waveform data to a parallel/serial conversion circuit.

8. A light output control circuit as set forth in claim 6, wherein said fine width pulse generating means generates said fine width pulse from two adjacent phase shift pulses among the phase shifted pulses shifted by said phase shifting means.

9. A light output control circuit as set forth in claim 6, wherein:

the circuit comprises a changing means for receiving as input two adjacent phase shift pulses among the phase shift pulses shifted by said phase shifting means and changing their levels to different levels, and said fine width pulse generating means generates said fine width pulse from the two phase shift pulses changed in level by said level changing means.

10. A light output control circuit as set forth in claim 6, wherein said phase shifting means includes a ring oscillator connecting a plurality of cells in a ring.

11. A light output control circuit as set forth in claim 6, wherein:

said phase shifting means includes a ring oscillator connecting a plurality of delay cells in a ring, and said plurality of delay cells are laid out so as to make delays cells which become odd-numbered stages and even-numbered stages when connected in a ring face each other and so that interconnects which connect them become approximately equal.

12. An optical recording apparatus for outputting a light source drive signal to a light source driver which writes data to an optical recording medium based on recording data indicating a length of a mark to be recorded on said optical recording medium, comprising:

a parallel/serial conversion circuit for receiving as input parallel signals based on waveform data read from a waveform data memory corresponding to a length of a mark recorded on the optical recording medium, converting said parallel signals to a serial pulse signal, and outputting the same to said light source driver, said parallel/serial conversion circuit comprising:

a phase shifting means for shifting a phase of a reference clock pulse by increments of 1/n width of the pulse width, a fine width pulse generating means for receiving as input two phase shift pulses among said phase shift pulses shifted by said phase shifting means and generating a fine width pulse based on a phase difference between the two, and a serial signal generating means for serially adding the fine width pulses generated by said fine width pulse generating corresponding to said parallel signal input and outputting a serial pulse signal.

13. An optical recording apparatus as set forth in claim 12, further comprising:

a waveform data memory for storing waveform data corresponding to data to be emitted by the light source, an accessing means for receiving as input the data to be emitted by the light source, judging the address of the waveform data memory corresponding to the input data, and accessing said waveform data memory, and a decoding means for decoding the waveform data read from the waveform data memory by said accessing means and outputting parallel signals which indicate the pulse waveform data to a parallel/serial conversion circuit.

14. An optical recording apparatus as set forth in claim 12, wherein said fine width pulse generating means generates said fine width pulse from two adjacent phase shift pulses among the phase shifted pulses shifted by said phase shifting means.

15. An optical recording apparatus as set forth in claim 12, wherein:

the circuit comprises a changing means for receiving as input two adjacent phase shift pulses among the phase shift pulses shifted by said phase shifting means and changing their levels to different levels, and said fine width pulse generating means generates said fine width pulse from the two phase shift pulses changed in level by said level changing means.

* * * * *